United States Patent
Ji et al.

(10) Patent No.: US 9,299,704 B2
(45) Date of Patent: Mar. 29, 2016

(54) SEMICONDUCTOR DEVICE AND METHOD FOR FABRICATING THE SAME

(71) Applicant: SK hynix Inc., Gyeonggi-do (KR)

(72) Inventors: Yun-Hyuck Ji, Gyeonggi-do (KR);
Moon-Sig Joo, Gyeonggi-do (KR);
Se-Aug Jang, Gyeonggi-do (KR);
Hyung-Chul Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/489,237

(22) Filed: Sep. 17, 2014

(65) Prior Publication Data

US 2015/0380407 A1    Dec. 31, 2015

(30) Foreign Application Priority Data

Jun. 26, 2014   (KR) ................. 10-2014-0078856

(51) Int. Cl.
| | |
|---|---|
| *H01L 27/092* | (2006.01) |
| *H01L 21/8238* | (2006.01) |
| *H01L 29/49* | (2006.01) |
| *H01L 21/28* | (2006.01) |
| *H01L 21/3213* | (2006.01) |
| *H01L 21/02* | (2006.01) |
| *H01L 21/285* | (2006.01) |

(52) U.S. Cl.
CPC ...... *H01L 27/0922* (2013.01); *H01L 21/02186* (2013.01); *H01L 21/02192* (2013.01); *H01L 21/28088* (2013.01); *H01L 21/28568* (2013.01); *H01L 21/32139* (2013.01); *H01L 21/823828* (2013.01); *H01L 29/4966* (2013.01)

(58) Field of Classification Search
CPC ................. H01L 21/28088; H01L 21/823842; H01L 29/66545; H01L 29/42364; H01L 29/7833
USPC .................. 257/211, 410, 369; 438/591, 592
See application file for complete search history.

(56) References Cited

U.S. PATENT DOCUMENTS

| | | | |
|---|---|---|---|
| 8,101,525 B2 | 1/2012 | Shen et al. | |
| 8,476,126 B2 | 7/2013 | Chuang et al. | |
| 8,563,411 B2 | 10/2013 | Lim et al. | |
| 2007/0215950 A1* | 9/2007 | Aoyama ....................... | 257/369 |
| 2010/0210112 A1* | 8/2010 | Shen et al. ................... | 438/710 |
| 2012/0256276 A1* | 10/2012 | Hwang et al. ................ | 257/410 |
| 2014/0061814 A1 | 3/2014 | Kim et al. | |
| 2015/0069533 A1* | 3/2015 | Lin et al. ...................... | 257/410 |
| 2015/0102416 A1* | 4/2015 | Yin ................ | H01L 21/823842 257/369 |

* cited by examiner

*Primary Examiner* — Cuong Q Nguyen
*Assistant Examiner* — Tong-Ho Kim
(74) *Attorney, Agent, or Firm* — IP & T Group LLP

(57) ABSTRACT

A method for fabricating a semiconductor device includes: forming a gate dielectric layer over a substrate; forming an etch stop layer over the gate dielectric layer; forming a first work function layer that covers a first portion of the etch stop layer and a sacrificial compound that covers a second portion of the etch stop layer; exposing the second portion of the etch stop layer by removing the sacrificial compound; and forming a second work function layer over the second portion of the etch stop layer and the first work function layer.

17 Claims, 14 Drawing Sheets

US 9,299,704 B2

SEMICONDUCTOR DEVICE AND METHOD FOR FABRICATING THE SAME

CROSS-REFERENCE TO RELATED APPLICATIONS

The present application claims priority of Korean Patent Application No. 10-2014-0078856, filed on Jun. 26, 2014, which is herein incorporated by reference in its entirety.

BACKGROUND

1. Field

Exemplary embodiments relate to a semiconductor device, and more particularly, to a semiconductor device using a Replacement Metal Gate (RMG) process and a method for fabricating the same.

2. Description of the Related Art

An electronic device is realized using a plurality of transistors, and the transistors continue to be scaled down. Although transistors are scaled down in size, the performance of the transistors has to be improved. To this end, a gate structure including a high-k material and a metal gate electrode is being suggested.

The metal gate electrode requires a work function metal to modulate the threshold voltage of a transistor. However, since the work function metal is vulnerable to subsequent thermal treatment, there is a limitation in increasing the threshold voltage of the transistor.

SUMMARY

An embodiment is directed to a semiconductor device including a work function metal having excellent thermal stability, and a method for fabricating the semiconductor device.

In accordance with an embodiment, a method for fabricating a semiconductor device may include forming a gate dielectric layer over a substrate; forming an etch stop layer over the gate dielectric layer; forming a first work function layer that covers a first portion of the etch stop layer and a sacrificial compound that covers a second portion of the etch stop layer; exposing the second portion of the etch stop layer by removing the sacrificial compound; and forming a second work function layer over the second portion of the etch stop layer and the first work function layer. The forming of the first work function layer that covers the first portion of the etch stop layer and the sacrificial compound that covers the second portion of the etch stop layer may include forming a sacrificial layer over the etch stop layer; removing the sacrificial layer over the first portion of the etch stop layer to form a sacrificial layer pattern over the second portion of the etch stop layer; and forming the first work function layer over the sacrificial layer pattern and the first portion of the etch stop layer, wherein the sacrificial layer pattern is transformed into the sacrificial compound while the first work function layer is formed over the first portion of the etch stop layer. The sacrificial layer may include lanthanum oxide, and the sacrificial compound may include lanthanum chloride. The first work function layer may include titanium nitride, wherein the first work function layer is formed by using titanium tetrachloride ($TiCl_4$). The first work function layer may include a titanium layer containing a first species, wherein the second work function layer may include a titanium layer containing a second species, and wherein the second work function layer and the first work function layer have different work functions. The first species may include nitrogen, and the second species may include aluminum, carbon, or a combination thereof. The etch stop layer may include tantalum nitride. The method for fabricating a semiconductor device may further include forming a capping layer over the gate dielectric layer, before the forming of the etch stop layer, wherein the capping layer includes titanium nitride.

In accordance with another embodiment, a method for fabricating a semiconductor device may include preparing a substrate including a first channel region and a second channel region; forming an inter-layer dielectric layer over the substrate, wherein the inter-layer dielectric layer includes a first trench exposing the first channel region and a second trench exposing the second channel region; forming a gate dielectric layer in the first trench and the second trench; forming an etch stop layer over the gate dielectric layer; forming a first work function layer over the etch stop layer in the first trench and forming a sacrificial compound over the etch stop layer in the second trench; exposing the etch stop layer in the second trench by removing the sacrificial compound; forming a second work function layer over the first work function layer in the first trench and over the etch stop layer in the second trench; and forming a low resistivity layer over the second work function layer to fill the first trench and the second trench. The forming of the first work function layer over the etch stop layer in the first trench and forming of the sacrificial compound over the etch stop layer in the second trench may includes forming a sacrificial layer over the etch stop layer; removing the sacrificial layer over the etch stop layer in the first trench to form a sacrificial layer pattern over the etch stop layer in the second trench; and applying first work function material to the first and the second trenches to form the first work function layer over the etch stop layer in the first trench and to transform the sacrificial layer pattern in the second trench into the sacrificial compound. The sacrificial layer may include lanthanum oxide, and the sacrificial compound may include lanthanum chloride. The first work function layer may include titanium nitride, and wherein the first work function material may include titanium tetrachloride ($TiCl_4$). The first work function layer may include titanium nitride, and wherein the second work function layer may include a titanium layer containing a second species, and wherein the second species is suitable to make the second work function layer and the first work function layer have different work functions. The species may include aluminum, carbon, or a combination thereof. The method for fabricating a semiconductor device may further include forming a capping layer over the gate dielectric layer, before the forming of the etch stop layer, wherein the capping layer may include titanium nitride. The etch stop layer may include tantalum nitride. The first work function layer is suitable to serve as a P-channel transistor, and the second work function layer is suitable to serve as an N-channel transistor.

In accordance with yet another embodiment, a semiconductor device may includes a substrate including a first channel region and a second channel region; an inter-layer dielectric layer that includes a first trench exposing the first channel region and a second trench exposing the second channel region; a first gate structure formed in the first trench and including a first interface layer, a first gate dielectric layer, a first capping layer, a first etch stop layer, a first work function layer, a dummy work function layer, and a first low resistivity layer that are stacked in the first trench; and a second gate structure formed in the second trench and including a second interface layer, a second gate dielectric layer, a second capping layer, a second etch stop layer, a second work function layer, and a second low resistivity layer that are stacked in the second trench, wherein the first work function layer contains a P-type work function metal, and the second work function layer contains an N-type work function metal. Each of the first capping layer and the second capping layer may include titanium nitride. Each of the first etch stop layer and the second etch stop layer may include tantalum nitride. The first work function layer may include titanium nitride. The second work function layer may include titanium aluminum (TiAl), titanium carbide (TiC), titanium aluminum carbide (TiAlC), or a combination thereof.

DETAILED DESCRIPTION

Figure 1:
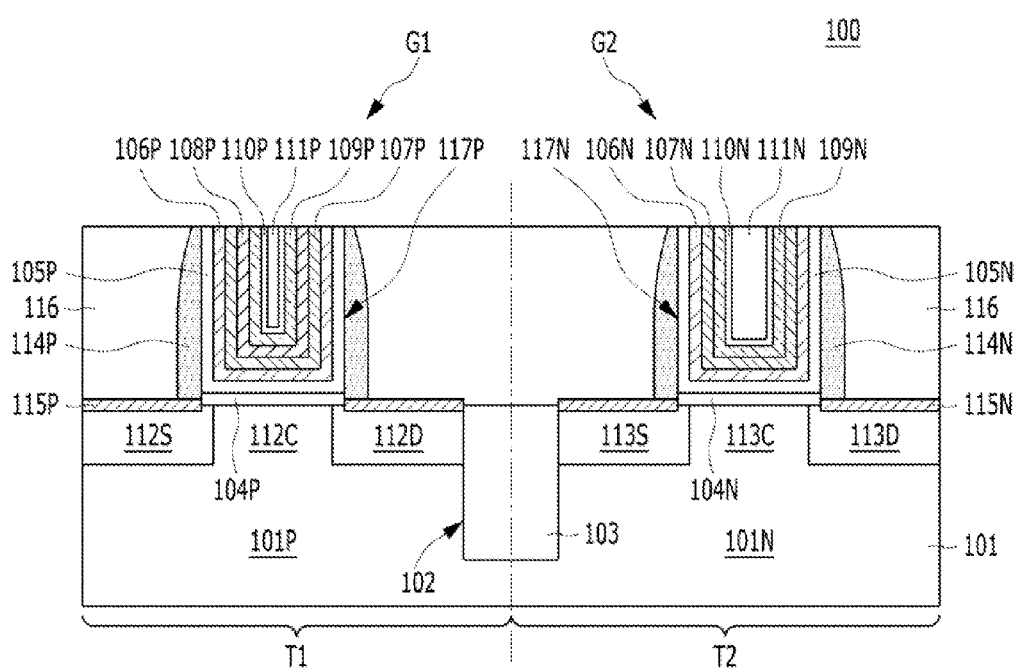
FIG. 1 is a cross-sectional view illustrating a semiconductor device in accordance with a first embodiment.

Exemplary embodiments will be described below in more detail with reference to the accompanying drawings. The embodiments should not be construed as limitative. Throughout the disclosure, like reference numerals refer to like parts in the various figures and embodiments.

The drawings are not necessarily to scale and, in some instances, proportions may have been exaggerated in order to clearly illustrate features of the embodiments. When a first layer is referred to as being "on" a second layer or "on" a substrate, it not only refers to where the first layer is formed directly on the second layer or the substrate but also where a third layer exists between the first layer and the second layer or the substrate.

FIG. 1 is a cross-sectional view illustrating a semiconductor device in accordance with a first embodiment.

Referring to FIG. 1, the semiconductor device 100 includes a first transistor T1 and a second transistor T2. The first transistor T1 and the second transistor T2 are formed in a substrate 101. The first transistor T1 and the second transistor T2 are separated from each other by an isolation region 103. The substrate 101 may include a semiconductor substrate. The substrate 101 may include a silicon substrate, a silicon germanium substrate, or a Silicon On Insulation (SOI) substrate. For the sake of simplifying the explanation, in the following embodiment, the substrate 101 is a silicon substrate. The isolation region 103 is formed in an isolation trench 102. The isolation region 103 may be formed by filling the isolation trench 102 with a dielectric material. The isolation region 103 defines a first region 101P and a second region 101N. The first region 101P is an active region where the first transistor T1 is to be formed, whereas the second region 101N is an active region where the second transistor T2 is to be formed.

An inter-layer dielectric layer 116 may be formed over the substrate 101. The inter-layer dielectric layer 116 may include a first trench 117P and a second trench 117N. The first trench 117P may be formed in the first region 101P, and the second trench 117N may be formed in the second region 101N. First spacers 114P may be formed on both sidewalls of the first trench 117P. Second spacers 114N may be formed on both sidewalls of the second trench 117N. The first spacers 114P and the second spacers 114N may be formed of the same material. The first spacers 114P and the second spacers 114N may include a silicon oxide, a silicon nitride, or a combination thereof.

The first transistor T1 includes a first gate structure G1, a first source region 112S, and a first drain region 112D. The first gate structure G1 may be formed in the first trench 117P. The first source region 112S and the first drain region 112D may be formed in the substrate 101 of the first region 101P. A first channel region 112C may be defined under the first gate structure G1. The first channel region 112C may be disposed between the first source region 112S and the first drain region 112D. The first source region 112S and the first drain region 112D may be doped with a P-type impurity. The first gate structure G1 may include a first interface layer 104P, a first gate dielectric layer 105P, a first capping layer 106P, a first etch stop layer 107P, a first work function layer 108P, a dummy second work function layer 109P, a first barrier layer 110P, and a first low resistivity layer 111P that are sequentially stacked therein. Each of the first gate dielectric layer 105P, the first capping layer 106P, the first etch stop layer 107P, the first work function layer 108P, the dummy second work function layer 109P, and the first barrier layer 110P may be formed in a liner pattern along a bottom surface and sidewalls of the first trench 117P. The first low resistivity layer 111P may be formed over the first barrier layer 110P to fill the first trench 117P.

The second transistor T2 includes a second gate structure G2, a second source region 113S, and a second drain region 113D. The second gate structure G2 may be formed in the second trench 117N. The second source region 113S and the second drain region 113D may be formed in the substrate 101 of the second region 101N. A second channel region 113C may be defined under the second gate structure G2. The second channel region 113C may be disposed between the second source region 113S and the second drain region 113D. The second source region 113S and the second drain region 113D may be doped with an N-type impurity. The second gate structure G2 may include a second interface layer 104N, a second gate dielectric layer 105N, a second capping layer 106N, a second etch stop layer 107N, a second work function layer 109N, a second barrier layer 110N, and a second low resistivity layer 111N that are sequentially stacked therein. Each of the second gate dielectric layer 105N, the second capping layer 106N, the second etch stop layer 107N, the second work function layer 109N, and the second barrier layer 110N may be formed in a liner pattern along the bottom surface and sidewalls of the second trench 117N. The second low resistivity layer 111N may be formed over the second barrier layer 110N to fill the second trench 117N.

Hereafter, the first transistor T1 and the second transistor T2 are described in detail.

The first interface layer 104P and the second interface layer 104N may be formed of the same material. The first interface layer 104P and the second interface layer 104N may be formed of a silicon oxide.

The first gate dielectric layer 105P and the second gate dielectric layer 105N may be formed of the same material. The first gate dielectric layer 105P and the second gate dielectric layer 105N may be formed of a high-k material. The high-k material includes a material whose dielectric constant is greater than those of a silicon oxide and a silicon nitride. The high-k material may include a hafnium oxide ($HfO_2$), a hafnium silicate (HfSiO), a hafnium oxynitride (HfON), or a hafnium silicon oxynitride (HfSiON). According to another embodiment, the high-k material may include ZrO2, HfZrON, HfLaO, or HfLaON.

The first capping layer 106P and the second capping layer 106N may be formed of the same material. The first capping layer 106P and the second capping layer 106N may be formed of a metal nitride. The first capping layer 106P and the second capping layer 106N may be formed of a titanium nitride (TiN).

The first etch stop layer 107P and the second etch stop layer 107N may be formed of the same material. The first etch stop layer 107P and the second etch stop layer 107N may be formed of a metal nitride. The first etch stop layer 107P and the second etch stop layer 107N may be formed of a tantalum nitride (TaN).

The first work function layer 108P may have a work function capable of modulating a threshold voltage of the first transistor T1. For example, the first work function layer 108P may include a P-type work function metal layer. The first work function layer 108P may be a first titanium-containing layer having a P-type work function. The P-type work function refers to a high work function greater than approximately 4.9 eV. The first titanium-containing layer may contain a first species to have the P-type work function. The first species may include nitrogen. In an embodiment, the first work function layer 108P may be a titanium layer containing the first species. For example, the first work function layer 108P may include a titanium nitride (TiN). The first work function layer 108P may be formed by Chemical Vapor Deposition using titanium tetrachloride (TiCl$_4$) and ammonia (NH$_3$). It is referred to as a titanium tetrachloride (TiCl$_4$)-based titanium nitride (TiN).

The second work function layer 109N may have a work function capable of modulating a threshold voltage of the second transistor T2. For example, the second work function layer 109N may include an N-type work function metal layer. The second work function layer 109N may be a second titanium-containing layer having an N-type work function. The N-type work function refers to a work function lower than approximately 4.2 eV. The second titanium-containing layer may contain a second species having an N-type work function. The second species may include carbon (C), aluminum (Al), or a mixture thereof. In an embodiment, the second work function layer 109N may be a titanium layer containing the second species. For example, the second work function layer 109N may include TiAl, TiC, TiAlC, or a combination thereof. The second work function layer 109N may be formed of the same material as the dummy second work function layer 109P. The dummy second work function layer 109P formed over the first work function layer 108P does not affect the threshold voltage of the first transistor T1.

The first low resistivity layer 111P and the second low resistivity layer 111N may be formed of the same material. The first low resistivity layer 111P and the second low resistivity layer 111N may include a low-resistivity metal layer. The first low resistivity layer 111P and the second low resistivity layer 111N may include tungsten, cobalt, titanium, aluminum, or a combination thereof.

The first barrier layer 110P and the second barrier layer 110N may include a titanium nitride (TiN).

The first transistor T1 may be a P-type metal-oxide-semiconductor field-effect-transistor (PMOSFET), and the second transistor T2 may be an N-type metal-oxide-semiconductor field-effect-transistor (NMOSFET). The semiconductor device 100 may be a complementary metal-oxide-semiconductor field-effect-transistor (CMOSFET). Since each of the first transistor T1 and the second transistor T2 includes a gate dielectric layer of a high-k material and a gate electrode of metallic materials, each of them may be referred to as a High-K Metal Gate (HKMG). The first gate structure G1 and the second gate structure G2 may be formed by a Replacement Metal Gate (RMG) process. The RMG process may also be referred to as a Gate Last process.

According to the first embodiment, the first gate structure G1 including the first work function layer 108P may modulate the threshold voltage of the first transistor T1. Also, the second gate structure G2 including the second work function layer 109N may modulate the threshold voltage of the second transistor T2.

FIGS. 2A to 2L are cross-sectional views illustrating a method for fabricating a semiconductor device in accordance with the first embodiment.

Figure 2A:
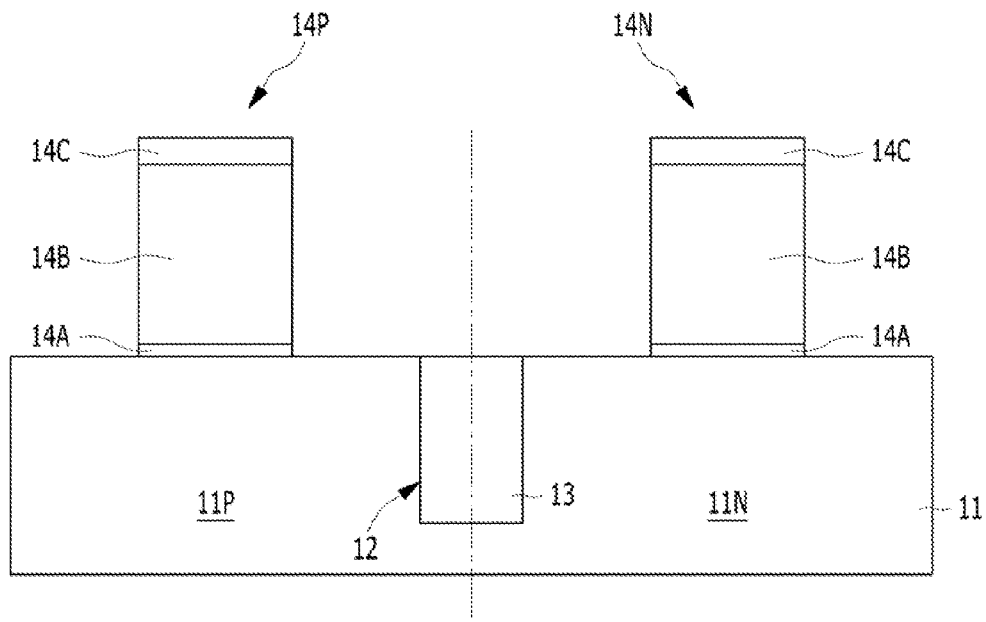
FIGS. 2A to 2L are cross-sectional views illustrating a method for fabricating the semiconductor device in accordance with the first embodiment.

Referring to FIG. 2A, a substrate 11 includes a first region 11P and a second region 11N. The substrate 11 may include a semiconductor material. For example, the substrate 11 may be a silicon substrate, a silicon germanium substrate, or a Silicon On Insulator (SOI) substrate. The first region 11P may be an active region for a P-channel transistor, and the second region 11N may be an active region for an N-channel transistor.

An isolation region 13 is formed in the substrate 11. The isolation region 13 isolates the first region 11P and the second region 11N from each other. In other words, the isolation region 13 is formed to isolate the P-channel transistor and the N-channel transistor from each other. The isolation region 13 may be formed by an isolation technology such as a Shallow Trench Isolation (STI) process. For example, the isolation region 13 may be formed by etching the substrate 11 to form an isolation trench 12 and filling the isolation trench 12 with dielectric material. The isolation trench 12 may be filled with an oxide, a nitride, or a mixture thereof.

A first dummy structure 14P and a second dummy structure 14N are formed over the substrate 11. The first dummy structure 14P is formed over the substrate 11 in the first region 11P. The second dummy structure 14N is formed over the substrate 11 in the second region 11N. The first dummy structure 14P and the second dummy structure 14N may be formed by stacking and etching diverse material layers. The first dummy structure 14P and the second dummy structure 14N may have a stack of the same material layers. Each of the first dummy structure 14P and the second dummy structure 14N may have a first dummy layer 14A, a second dummy layer 14B, and a third dummy layer 14C stacked therein. The first dummy layer 14A may be formed of a silicon oxide. The second dummy layer 14B may be formed of polysilicon. The third dummy layer 14C may be formed of a silicon nitride. For example, the first dummy structure 14P and the second dummy structure 14N may be formed by stacking a silicon oxide, polysilicon, and a silicon nitride and etching them using a mask pattern (not shown). The first dummy layer 14A may be referred to as a dummy gate oxide. The second dummy layer 14B may be referred to as a dummy gate. The third dummy layer 14C may be referred to as a dummy gate hard mask. The second dummy layer 14B may be formed of polysilicon or another kind of semiconductor material. Each of the first dummy structure 14P and the second dummy structure 14N may be referred to as a dummy gate structure.

Figure 2B:
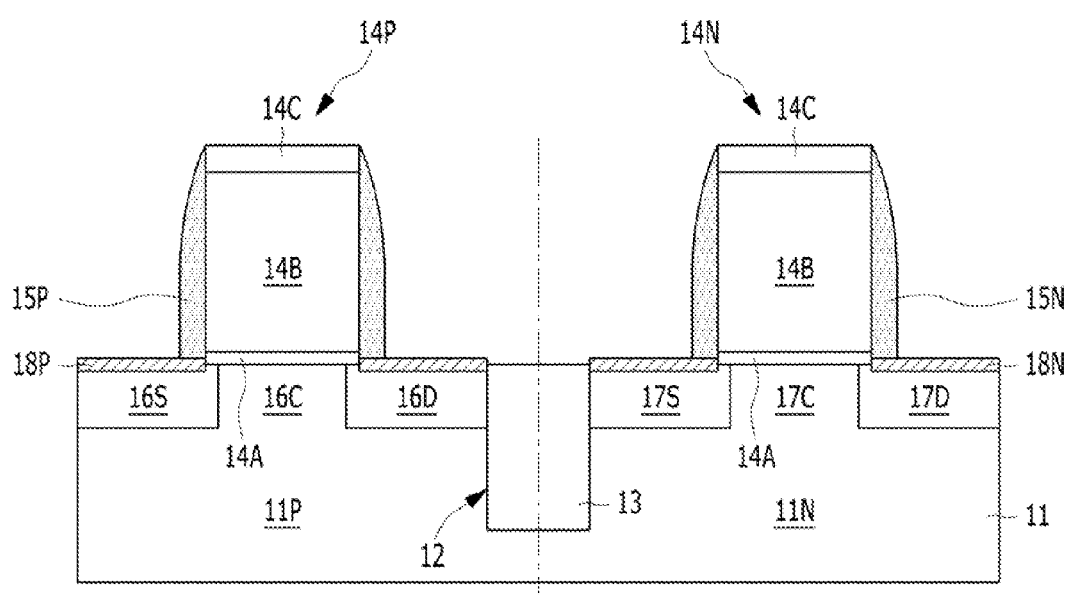

Referring to FIG. 2B, first spacers 15P are formed on both sidewalls of the first dummy structure 14P. Second spacers 15N are formed on both sidewalls of the second dummy structure 14N. The first spacers 15P and the second spacers 15N may be formed of a silicon nitride. For example, the first spacers 15P and the second spacers 15N may be formed by depositing a silicon nitride on the substrate 11 including the first dummy structure 14P and the second dummy structure 14N and performing an etch-back process. The first spacers 15P and the second spacers 15N may be referred to as gate spacers. The first spacers 15P and the second spacers 15N may be of a multi-layer structure. For example, the first spacers 15P and the second spacers 15N may be formed of a combination of a silicon oxide and a silicon nitride and may include, for example, ON (Oxide/Nitride), ONO (Oxide/Nitride/Oxide), OON (Oxide/Oxide/Nitride), NON (Nitride/Oxide/Nitride), and ONON (Oxide/Nitride/Oxide/Nitride).

A first source region 16S and a first drain region 16D are formed in the first region 11P of the substrate 11. The first source region 16S and the first drain region 16D may be formed by sequentially performing a doping process and an activation annealing process. The doping process may include a plasma doping process or an implantation process. The first source region 16S and the first drain region 16D may be doped with a P-type impurity. The first source region 16S and the first drain region 16D may be doped with boron, indium or a mixture thereof. Although not illustrated in the drawing, the first source region 16S and the first drain region 16D may further include a source/drain extension (SDE) and a HALO region. The second region 11N may be masked while the first source region 16S and the first drain region 16D are formed. The first region 11P disposed between the first source region 16S and the first drain region 16D becomes a first channel region 16C. The first channel region 16C may include a silicon germanium channel.

A second source region 17S and a second drain region 17D are formed in the second region 11N of the substrate 11. The second source region 17S and the second drain region 17D may be formed by sequentially performing a doping process and an activation annealing process. The doping process may include a plasma doping process or an implantation process. The second source region 17S and the second drain region 17D may be doped with an N-type impurity. The second source region 17S and the second drain region 17D may be doped with, for example, arsenic, phosphorus, an antimony or a combination thereof. Although not illustrated in the drawing, the second source region 17S and the second drain region 17D may further include a source/drain extension (SDE) and a HALO region. The first region 11P may be masked while the second source region 17S and the second drain region 17D are formed. The second region 11N disposed between the second source region 17S and the second drain region 17D becomes a second channel region 17C. The second channel region 17C may include a silicon channel.

A first metal silicide layer 18P and a second metal silicide layer 18N are formed. The first metal silicide layer 18P is formed in the first source region 16S and the first drain region 16D. The second metal silicide layer 18N is formed in the second source region 17S and the second drain region 17D. The first metal silicide layer 18P and the second metal silicide layer 18N are formed of the same material. The first metal silicide layer 18P and the second metal silicide layer 18N may be nickel-containing silicide layers. For example, the first metal silicide layer 18P and the second metal silicide layer 18N may include nickel silicide layers or nickel platinum silicide layers, respectively.

Figure 2C:
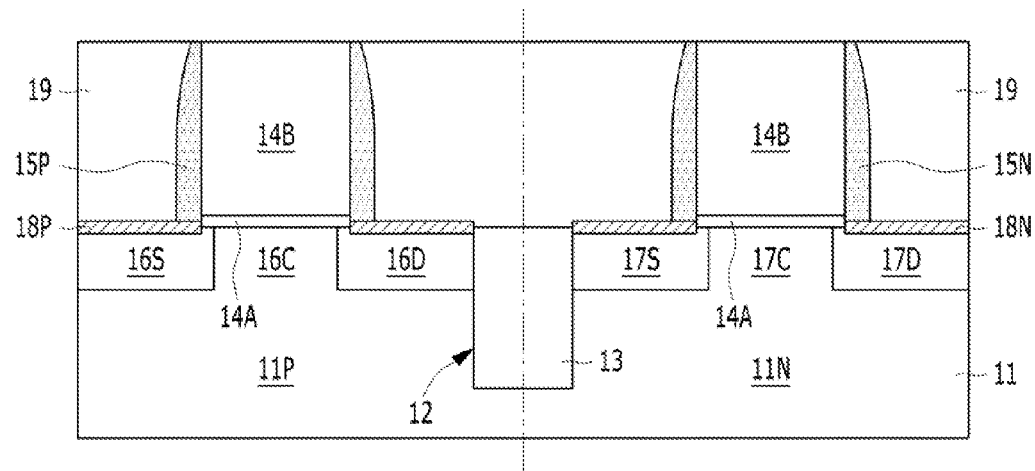

Referring to FIG. 2C, an inter-layer dielectric layer 19 is formed over the substrate 11. The inter-layer dielectric layer 19 may include a silicon oxide, a low dielectric material, or a combination thereof. The inter-layer dielectric layer 19 may be planarized to expose an upper surface of the second dummy layer 14B. For example, the inter-layer dielectric layer 19 is planarized until the upper surface of the second dummy layer 14B is exposed by a Chemical Mechanical Polishing (CMP) process. During the process that the inter-layer dielectric layer 19 is planarized, the third dummy layer 14C may be removed.

Figure 2D:
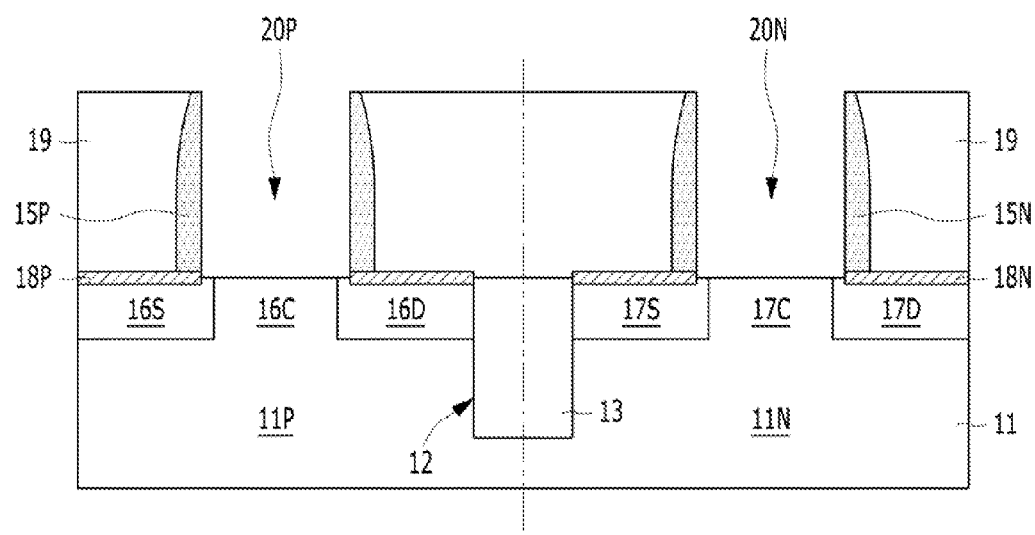

Referring to FIG. 2D, a first trench 20P and a second trench 20N are formed. The first trench 20P is formed in the first region 11P, and the second trench 20N is formed in the second region 11N. Each of the first trench 20P and the second trench 20N may be formed by removing the second dummy layer 14B and the first dummy layer 14A. The second dummy layer 14B and the first dummy layer 14A may be removed by a wet etch process or a dry etch process. As the second dummy layer 14B and the first dummy layer 14A are removed, the first channel region 16C and the second channel region 17C may be exposed. During the process in which the second dummy layer 14B and the first dummy layer 14A are removed, the inter-layer dielectric layer 19, the first spacers 15P, and the second spacers 15N may serve as etch barriers.

Figure 2E:
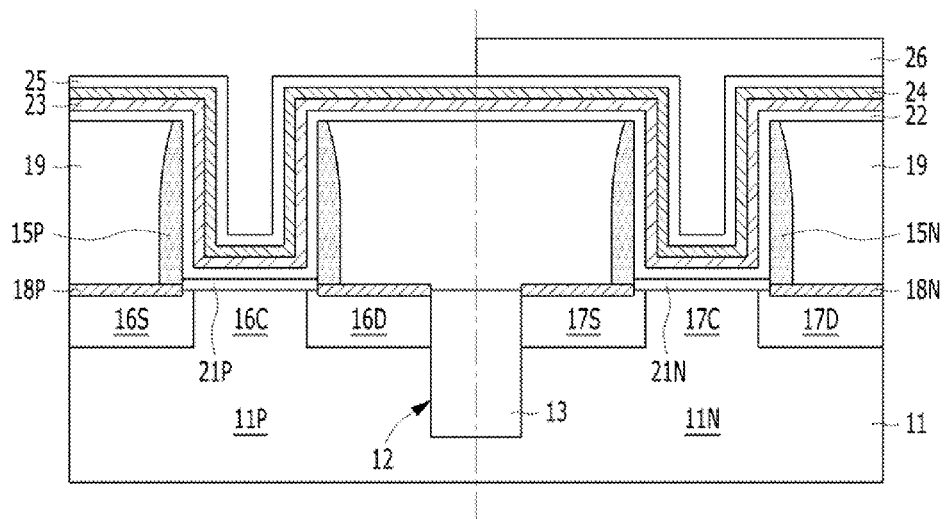

Referring to FIG. 2E, a first interface layer 21P and a second interface layer 21N are formed. The first interface layer 21P and the second interface layer 21N may be formed over the substrate 11. The first interface layer 21P and the second Interface layer 21N may be formed over bottom surfaces which are exposed by the first trench 20P and the second trench 20N, respectively. As a result, the first interface layer 21P and the second interface layer 21N may be formed over the first channel region 16C and the second channel region 17C, respectively. The first interface layer 21P and the second interface layer 21N may include a silicon oxide. For example, a silicon oxide may be formed by an oxidation process.

A gate dielectric layer 22 is formed. The gate dielectric layer 22 may be simultaneously formed in the first region 11P and in the second region 11N. The gate dielectric layer 22 is conformally formed in a liner pattern on the first interface layer 21P, the second interface layer 21N, sidewalls of the first trench 20P, sidewalls of the second trench 20N, and the inter-layer dielectric layer 19. The gate dielectric layer 22 may be formed of a high-k material. The high-k material may be a material having a dielectric constant of 9 or higher. The high-k material may include a hafnium oxide ($HfO_2$), a hafnium silicate (HfSiO), a hafnium oxynitride (HfON), a hafnium silicon oxynitride (HfSiON), or a combination thereof. According to another embodiment, the high-k material may include $ZrO_2$, HfZrON, HfLaO, HfLaON, a combination thereof.

A capping layer 23 and an etch stop layer 24 are stacked. The capping layer 23 protects the gate dielectric layer 22. The etch stop layer 24 may function as an etch stop layer during a subsequent etch process. The capping layer 23 and the etch stop layer 24 may be conformally formed in liner patterns over the gate dielectric layer 22. The capping layer 23 and the etch stop layer 24 may be simultaneously formed in the first region 11P and the second region 11N. The capping layer 23 and the etch stop layer 24 may be formed of a metal nitride. The capping layer 23 may be formed of a titanium nitride, whereas the etch stop layer 24 may be formed of a tantalum nitride (TaN). Over the capping layer 23 and the etch stop layer 24, a low resistivity layer may be formed in the subsequent process without void. Also, since the capping layer 23 and the etch stop layer 24 are metal-containing layers, they may reduce resistance of a gate structure.

A sacrificial layer 25 is formed over the etch stop layer 24. The sacrificial layer 25 may include a chloride-reactive material. The chloride-reactive material is a material capable of reacting with chlorine to form a chloride compound. The sacrificial layer 25 may include a lanthanum-containing material. The sacrificial layer 25 may include a lanthanum oxide. The sacrificial layer 25 does not affect the work function of the gate structure.

Subsequently, a mask pattern 26 is formed over the sacrificial layer 25 in the second region 11N. The mask pattern 26 covers the second region 11N while exposing the first region 11P. The mask pattern 26 may include a photoresist pattern.

Figure 2F:
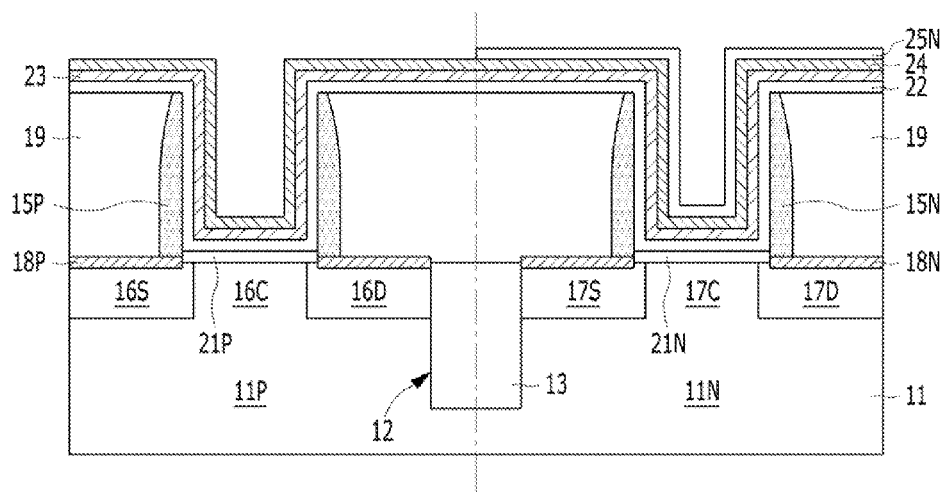

Referring to FIG. 2F, the sacrificial layer 25 is removed from the first region 11P. As a result, a sacrificial layer pattern 25N remains in an upper portion of the second region 11N. Hydrogen chloride (HCl) may be used to selectively remove the sacrificial layer 25. When the sacrificial layer 25 is removed, the etch process may be performed using the etch stop layer 24. Due to the etch stop layer 24, the gate dielectric layer 22 may be protected from being attacked by the hydrogen chloride (HCl).

The mask pattern 26 is removed.

As described above, the sacrificial layer 25 is removed from the first region 11P while the sacrificial layer pattern 25N remains in the second region 11N. To be specific, the sacrificial layer pattern 25N exposes a first portion of the etch stop layer 24, while covering a second portion. The first portion of the etch stop layer 24 is disposed in the first region 11P, and the second portion is disposed in the second region 11N.

Figure 2G:
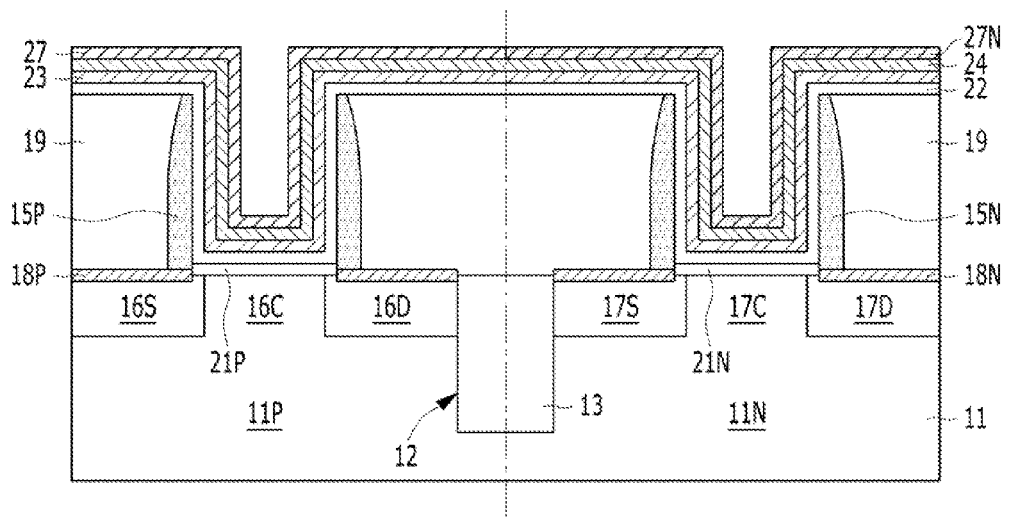

Referring to FIG. 2G, a first work function layer 27 is formed. The first work function layer 27 is formed in the first region 11P but not in the second region 11N. The first work function layer 27 may have a work function capable of modulating a threshold voltage of a first transistor. For example, the first work function layer 27 may be a P-type work function metal layer. To be specific, the first work function layer 27 may be a first titanium-containing layer having a P-type work function. The P-type work function refers to a high work function greater than approximately 4.9 eV. The first titanium-containing layer may contain a first species to have the P-type work function. The first species may include nitrogen. In an embodiment, the first work function layer 27 may be a titanium layer containing the first species. For example, the first work function layer 27 may include a titanium nitride (TiN). The first work function layer 27 may be formed by a Chemical Vapor Deposition using titanium tetrachloride (TiCl$_4$) and ammonia (NH$_3$).

During the process in which the first work function layer 27 is formed in the first region 11P, a sacrificial compound 27N may be formed in the second region 11N. The sacrificial compound 27N is a material derived from the sacrificial layer pattern 25N. The sacrificial compound 27N may include a chloride. The sacrificial compound 27N may be formed of a chloride of the sacrificial layer pattern 25N. The sacrificial compound 27N may be formed by a reaction between the sacrificial layer pattern 25N and the first work function layer 27. For example, when titanium tetrachloride (TiCl$_4$) is applied to the first region 11P and the second region 11N, titanium tetrachloride (TiCl$_4$) applied to the first region 11P forms the first work function layer 27, and the titanium tetrachloride (TiCl$_4$) applied to the second region 11N reacts with the lanthanum forming of the sacrificial layer pattern 25N to form a lanthanum chloride. Thus, the sacrificial compound 27N of the lanthanum chloride, instead of the first work function layer 27, is deposited in the second region 11N.

As described above, the first work function layer 27 is formed over the first region 11P only, and the sacrificial compound 27N is formed over the second region 11N only. The first work function layer 27 is not deposited over the second region 11N due to the sacrificial compound 27N present in the second region 11N.

Figure 2H:
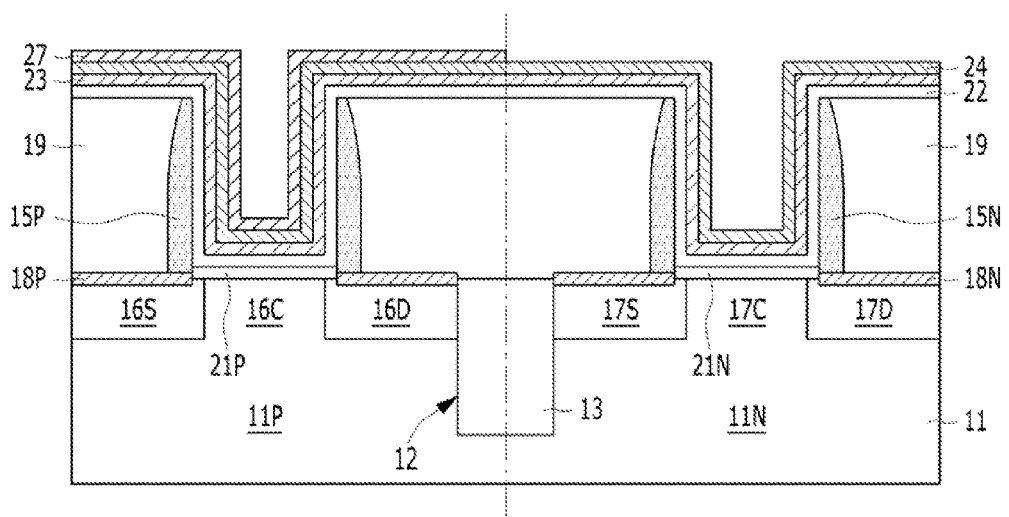

Referring to FIG. 2H, the sacrificial compound 27N present in the second region 11N is removed. To remove the sacrificial compound 27N, a cleaning process may be performed. During the process in which the sacrificial compound 27N is removed, the etch stop layer 24 protects the capping layer 23 and the gate dielectric layer 22.

As described above, the first work function layer 27 may be selectively formed in the first region 11P alone by the processes of forming the first work function layer 27 and removing the sacrificial compound 27N. In other words, the first work function layer 27 may be selectively formed over the first region 11P alone without a mask process and an etch process. By using a sacrificial layer pattern 25N, the first work function layer 27 appropriate for the first transistor may be easily formed without a mask process and an etch process.

Figure 2I:
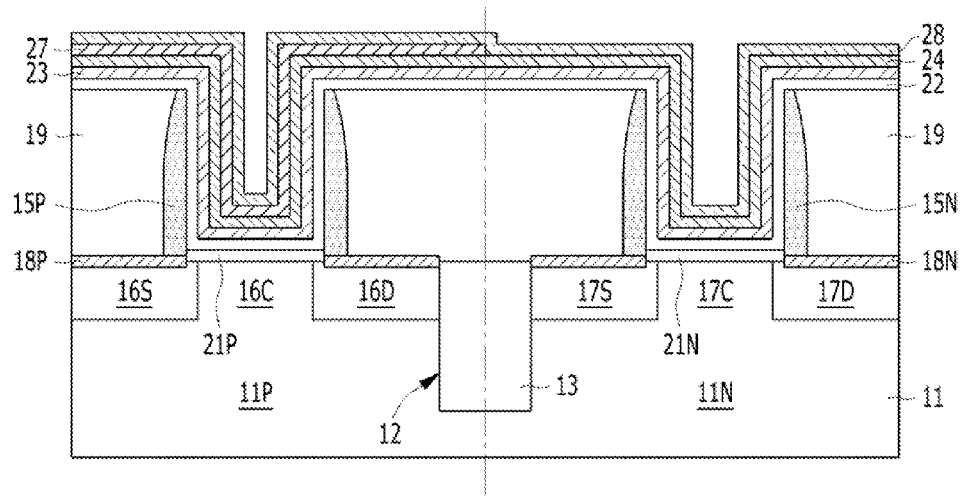

Referring to FIG. 2I, a second work function layer 28 is formed. The second work function layer 28 is formed over the etch stop layer 24 in the second region 11N and the first work function layer 27 in the first region 11P. The second work function layer 28 may have a work function capable of modulating a threshold voltage of a second transistor. The second work function layer 28 may include an N-type work function metal layer. The second work function layer 28 may be a second titanium-containing layer having an N-type work function. The N-type work function refers to a work function lower than approximately 4.2 eV. The second titanium-containing layer may contain a second species to have the N-type work function. The second species may include carbon (C), aluminum (Al), or a mixture thereof. In an embodiment, the second work function layer 28 may be a titanium layer containing the second species. In short, the second work function layer 28 may include TiAl, TiC, TiAlC, or a combination thereof. The second work function layer 28 may be formed in the second region 11N and the first region 11P. The second work function layer 28 formed in the first region 11P does not affect the threshold voltage of a P-channel transistor and serves as a dummy pattern.

Figure 2J:
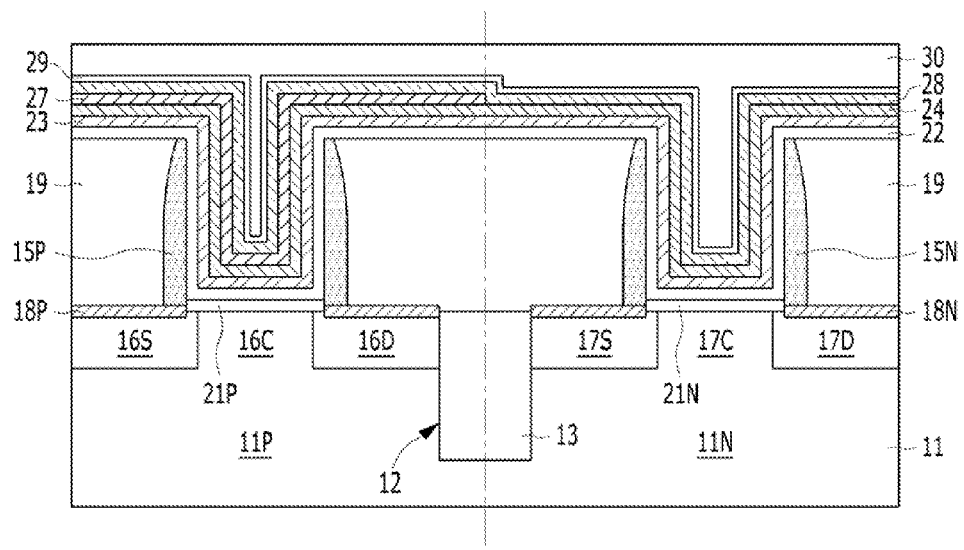

Referring to FIG. 2J, a low resistivity layer 30 is formed over the second work function layer 28. The low resistivity layer 30 fills the first trench 20P and the second trench 20N. The low resistivity layer 30 may include a low resistivity metal layer. The low resistivity layer 30 may include tungsten, cobalt, titanium, aluminum, or a combination thereof. Before the low resistivity layer 30 fills the first trench 20P and the second trench 20N, a barrier layer 29 may be conformally formed in a liner pattern in the first trench 20P and the second trench 20N. The barrier layer 29 may include a titanium nitride (TiN). The barrier layer 29 may prevent the low resistivity layer 30 and the second work function layer 28 from diffusing into each other. The stacked structure of the barrier layer 29 and the low resistivity layer 30 may include TiN/W, TiN/Ti/Al, and TiN/Co/Al.

Figure 2K:
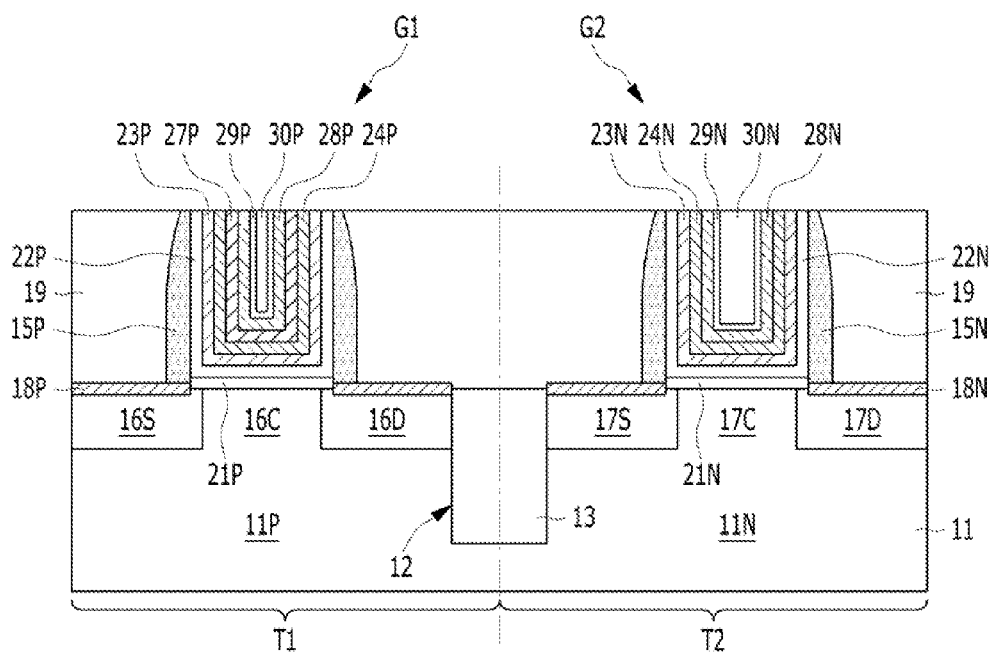

Referring to FIG. 2K, the low resistivity layer 30 is planarized until the Inter-layer dielectric layer 19 is exposed. After the low resistivity layer 30 is planarized, the barrier layer 29, the second work function layer 28, the first work function layer 27, the etch stop layer 24, the capping layer 23 and the gate dielectric layer 22 may be successively planarized.

Through a series of the planarization processes, a first gate structure G1 and a second gate structure G2 are formed in the first region 11P and the second region 11N, respectively.

The first gate structure G1 is disposed in the first region 11P. The first gate structure G1 includes the first interface layer 21P, a first gate dielectric layer 22P, a first capping layer 23P, a first etch stop layer 24P, a first work function layer 27P, a dummy second work function layer 28P, a first barrier layer 29P, and a first low resistivity layer 30P. The dummy second work function layer 28P is formed by planarizing the second work function layer 28 disposed in the first region 11P. Therefore, a first transistor T1 including the first gate structure G1, the first source region 16S, the first drain region 16D, and the first channel region 16C, is formed. The first transistor T1 may serve as a PMOSFET.

The second gate structure G2 is disposed in the second region 11N. The second gate structure G2 includes the second interface layer 21N, a second gate dielectric layer 22N, a second capping layer 23N, a second etch stop layer 24N, a second work function layer 28N, a second barrier layer 29N, and a second low resistivity layer 30N. Therefore, a second transistor T2 including the second gate structure G2, the second source region 17S, the second drain region 17D, and the second channel region 17C is formed. The second transistor T2 may serve as an NMOSFET.

As described above, the first gate structure G1 and the second gate structure G2 are formed by a Replacement Metal Gate (RMG) process. The first gate structure G1 and the second gate structure G2 may be referred to as a first replacement metal gate (RMG) and a second RMG, respectively. In the RMG process, the first source region 16S and the first drain region 16D are formed first and then the first gate structure G1 is formed. Likewise, the second gate structure G2 is formed after the second source region 17S and the second drain region 17D are formed. The method of forming a gate structure by the RMG process is also referred to as a 'Metal Gate Last (MGL) process' since the gate is formed later after the source and drain regions. According to the metal gate last process, a gate structure is formed after an activation annealing process which is performed to form a source region and a drain region. Since the first gate structure G1 and the second gate structure G2 are formed by the metal gate last process, thermal stability of the first work function layer 27P and the second work function layer 28N is improved. In sum, the threshold voltage may be modulated without suffering from the Fermi-pinning phenomenon, by employing the metal gate last process.

Also, since the gate dielectric layer 22 is formed after the first trench 20P and the second trench 20N are formed, the process according to the first embodiment may be referred to as a High K Last (HKL) process.

In short, the RMG structure in accordance with the first embodiment may be formed by the 'HKL (High K Last)/MGL (Metal Gate Last) process.

Figure 2L:
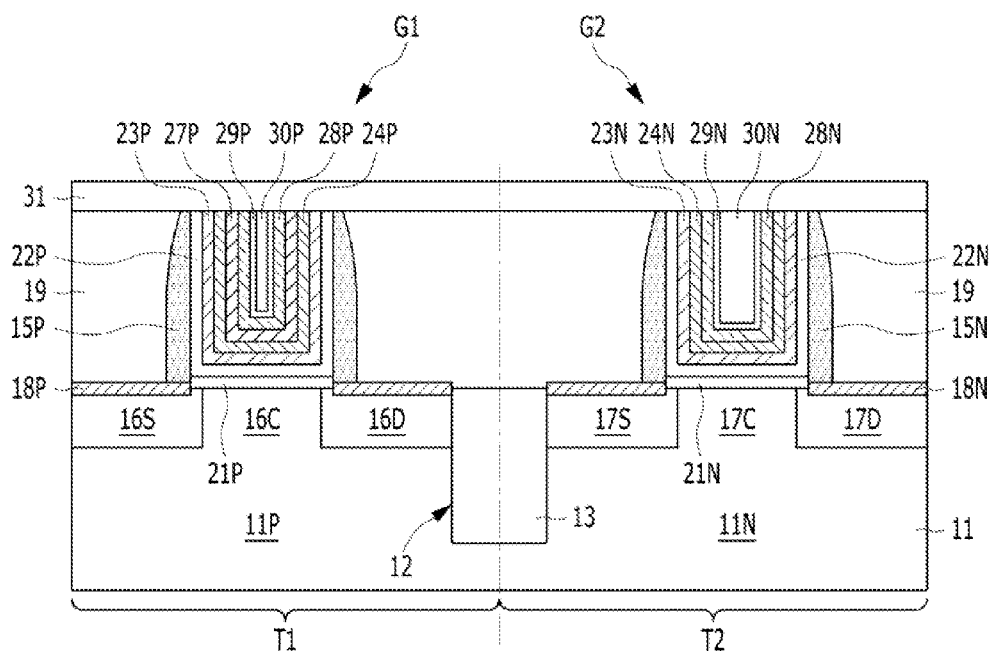

Referring to FIG. 2L, a cap layer 31 is formed. The cap layer 31 may include a silicon nitride. The cap layer 31 protects the first work function layer 27P, the second work function layer 28N, the first low resistivity layer 30P, and the second low resistivity layer 30N.

Figure 3:
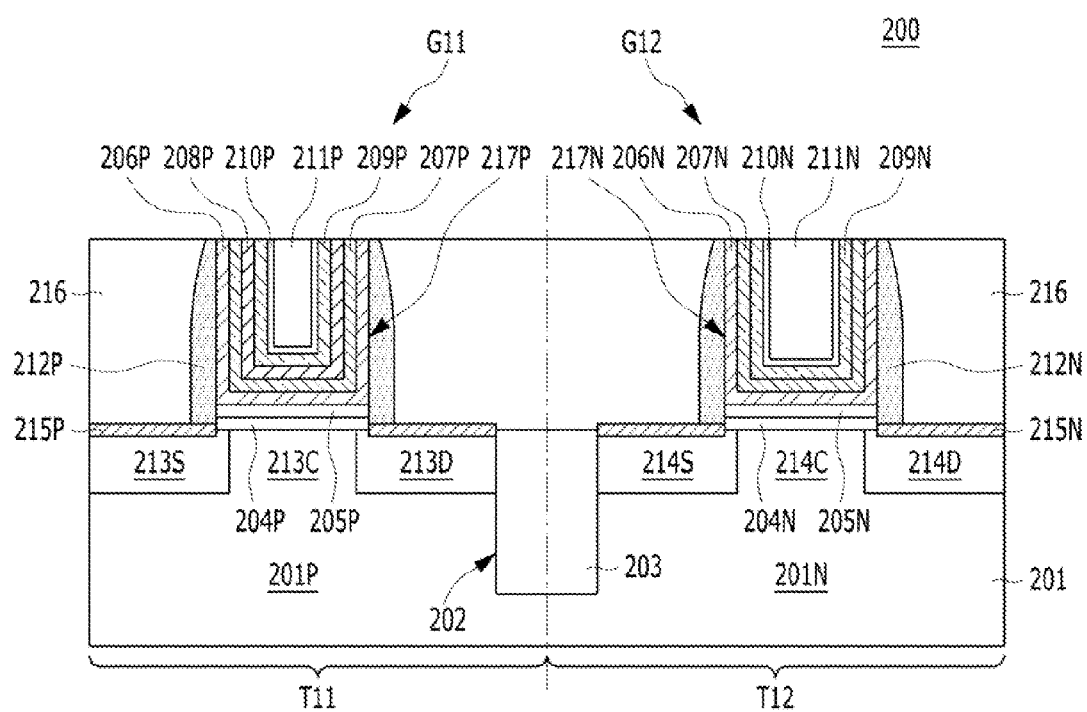
FIG. 3 is a cross-sectional view illustrating a semiconductor device in accordance with a second embodiment.

FIG. 3 is a cross-sectional view illustrating a semiconductor device in accordance with a second embodiment. The gate structure of the second embodiment may be similar to that of the first embodiment except for a gate dielectric layer.

Referring to FIG. 3, the semiconductor device 200 includes a first transistor T11 and a second transistor T12. The first transistor T11 and the second transistor T12 are formed in a substrate 201. The first transistor T11 and the second transistor T12 are separated from each other by an isolation region 203. The isolation region 203 is formed in an isolation trench 202. The isolation region 203 defines a first region 201P and a second region 201N. The first region 201P is an active region where the first transistor T11 is to be formed, whereas the second region 201N is an active region where the second transistor T12 is to be formed.

An inter-layer dielectric layer 216 may be formed over the substrate 201. The inter-layer dielectric layer 216 may be formed in a first trench 217P and a second trench 217N. The first trench 217P may be formed in the first region 201P, and the second trench 217N may be formed in the second region 201N. First spacers 212P may be formed on both sidewalls of the first trench 217P. Second spacers 217N may be formed on both sidewalls of the second trench 217N.

The first transistor T11 includes a first gate structure G11, a first source region 213S, and a first drain region 213D. The first gate structure G11 may be formed in the first trench 217P. The first source region 213S and the first drain region 213D may be formed in the first region 201P of the substrate 201. A first channel region 213C may be defined under the first gate structure G11. The first channel region 213C may be disposed between the first source region 213S and the first drain region 213D. The first source region 213S and the first drain region 213D may be doped with a P-type impurity. The first gate structure G11 may include a first interface layer 204P, a first gate dielectric layer 205P, a first capping layer 206P, a first etch stop layer 207P, a first work function layer 208P, a dummy second work function layer 209P, a first barrier layer 210P, and a first low resistivity layer 211P that are sequentially stacked in the first trench 217P. Similar to the first embodiment, the first gate dielectric layer 205P is provided between the first interface layer 204P and the first capping layer 206P. However, different from the first embodiment, the first gate dielectric layer 205P does not extend between the first spacer 212P and the first capping layer 206P. The first capping layer 206P, the first etch stop layer 207P, the first work function layer 208P, the dummy second work function layer 209P, and the first barrier layer 210P may be formed in liner patterns along a bottom surface and sidewalls of the first trench 217P. The first low resistivity layer 211P may be formed over the first barrier layer 210P to fill the first trench 217P.

The second transistor T12 includes a second gate structure G12, a second source region 214S, and a second drain region 214D. The second gate structure G12 may be formed in the second trench 217N. The second source region 214S and the second drain region 214D may be formed in the substrate 201 of the second region 201N. A second channel region 214C may be defined under the second gate structure G12. The second channel region 214C may be disposed between the second source region 214S and the second drain region 214D. The second source region 214S and the second drain region 214D may be doped with an N-type impurity. The second gate structure G12 may include a second interface layer 204N, a second gate dielectric layer 205N, a second capping layer 206N, a second etch stop layer 207N, a second work function layer 209N, a second barrier layer 210N, and a second low resistivity layer 211N that are sequentially stacked therein. Similar to the first embodiment, the second gate dielectric layer 205N is provided between the second interface layer 204N and the second capping layer 206N. However, different from the first embodiment, the second gate dielectric layer 205N does not extend between the second spacer 212N and the second capping layer 206N. The second capping layer 206N, the second etch stop layer 207N, the second work function layer 209N, and the second barrier layer 210N may be formed in liner patterns along a bottom surface and sidewalls of the second trench 217N. The second low resistivity layer 211N may be formed over the second barrier layer 210N to fill the second trench 217N.

Hereafter, the first transistor T11 and the second transistor T12 are described in detail.

The first interface layer 204P and the second interface layer 204N may be formed of the same material. The first interface layer 204P and the second interface layer 204N may be formed of a silicon oxide.

The first gate dielectric layer 205P and the second gate dielectric layer 205N may be formed of the same material.

The first gate dielectric layer 205P and the second gate dielectric layer 205N may be formed of a high-k material. The high-k material includes a material whose dielectric constant is greater than those of a silicon oxide and a silicon nitride. The high-k material may include a hafnium oxide ($HfO_2$), a hafnium silicate (HfSiO), a hafnium oxynitride (HfON), or a hafnium silicon oxynitride (HfSiON). According to another embodiment, the high-k material may include ZrO2, HfZrON, HfLaO, or HfLaON.

The first capping layer 206P and the second capping layer 206N may be formed of the same material. The first capping layer 206P and the second capping layer 206N may be formed of a metal nitride. The first capping layer 206P and the second capping layer 206N may be formed of a titanium nitride (TiN).

The first etch stop layer 207P and the second etch stop layer 207N may be formed of the same material. The first etch stop layer 207P and the second etch stop layer 207N may be formed of a metal nitride. The first etch stop layer 207P and the second etch stop layer 207N may be formed of a tantalum nitride (TaN).

The first work function layer 208P may have a work function capable of modulating a threshold voltage of the first transistor T11. For example, the first work function layer 208P may be a P-type work function metal layer. The first work function layer 208P may be a first titanium-containing layer having a P-type work function. The P-type work function refers to a high work function greater than approximately 4.9 eV. The first titanium-containing layer may contain a first species to have the P-type work function. The first species may include nitrogen. In an embodiment, the first work function layer 208P may be a titanium layer containing the first species. In short, the first work function layer 208P may be formed of a titanium nitride (TiN). The first work function layer 208P may be formed by a Chemical Vapor Deposition using titanium tetrachloride ($TiCl_4$) and ammonia ($NH_3$).

The second work function layer 209N may have a work function capable of modulating a threshold voltage of the second transistor T12. For example, the second work function layer 209N may be formed of an N-type work function metal layer. The second work function layer 209N may be a second titanium-containing layer having an N-type work function. The N-type work function refers to a work function lower than approximately 4.2 eV. The second titanium-containing layer may contain a second species to have the N-type work function. The second species may include carbon (C), aluminum (Al), or a mixture thereof. In the present embodiment, the second work function layer 209N may be a titanium layer containing the second species. In short, the second work function layer 209N may be formed of TiAl, TiC, or TiAlC. The second work function layer 209N may be formed of the same material as the dummy second work function layer 209P. The dummy second work function layer 209P, which is formed over the first work function layer 208P, does not affect the threshold voltage of the first transistor T11.

The first barrier layer 210P and the second barrier layer 210N may include a titanium nitride (TiN).

The first low resistivity layer 211P and the second low resistivity layer 211N may be formed of the same material. The first low resistivity layer 211P and the second low resistivity layer 211N may include a low-resistivity metal layer. The first low resistivity layer 211P and the second low resistivity layer 211N may include tungsten, cobalt, titanium, aluminum, or a combination thereof.

The first transistor T11 may be a PMOSFET, and the second transistor T12 may be an NMOSFET. The semiconductor device 200 may be a CMOSFET. The first gate structure G1 and the second gate structure G2 may be formed by a Replacement Metal Gate (RMG) process.

According to the second embodiment, the first gate structure G1 including the first work function layer 208P may modulate the threshold voltage of the first transistor T11. Also, the second gate structure G12 including the second work function layer 209N may modulate the threshold voltage of the second transistor T12.

FIGS. 4A to 4K are cross-sectional views illustrating a method for fabricating the semiconductor device in accordance with the second embodiment.

Figure 4A:
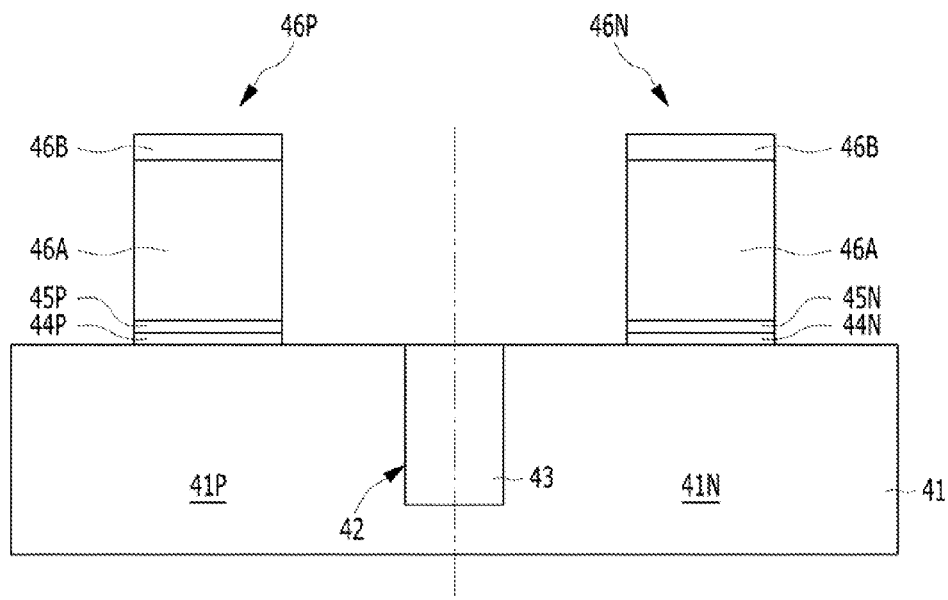
FIGS. 4A to 4K are cross-sectional views illustrating a method for fabricating the semiconductor device in accordance with the second embodiment.

Referring to FIG. 4A, a substrate 41 includes a first region 41P and a second region 41N. The substrate 41 may include a semiconductor material. For example, the substrate 41 may be a silicon substrate, a silicon germanium substrate, or a Silicon On Insulator (SOI) substrate. The first region 41P may be an active region for a P-channel transistor, and the second region 41N may be an active region for an N-channel transistor.

An isolation region 43 is formed in the substrate 41. The isolation region 43 isolates the first region 41P and the second region 41N from each other. In other words, the isolation region 43 is formed to isolate a P-channel transistor and an N-channel transistor from each other. The isolation region 43 may be formed through an isolation technology such as a Shallow Trench Isolation (STI) process. For example, the isolation region 43 may be formed by etching the substrate 41 to form an isolation trench 42 and filling the isolation trench 42 with dielectric material. The isolation trench 42 may be filled with an oxide, a nitride, or a mixture thereof.

A preliminary first gate structure 46P and a preliminary second gate structure 46N are formed over the substrate 41. The preliminary first gate structure 46P is formed in the first region 41P of the substrate 41. The preliminary second gate structure 46N is formed in the second region 41N of the substrate 11. The preliminary first gate structure 46P and the preliminary second gate structure 46N may be formed by stacking and etching diverse material layers. The preliminary first gate structure 46P and the preliminary second gate structure 46N may have a stack of the same material layers. Each of the preliminary first gate structure 46P and the preliminary second gate structure 46N may include a first dummy layer 46A and a second dummy layer 46B. The preliminary first gate structure 46P may have a first interface layer 44P, a first gate dielectric layer 45P, a first dummy layer 46A, and a second dummy layer 46B. The preliminary second gate structure 46N may have a second interface layer 44N, a second gate dielectric layer 45N, a first dummy layer 46A, and a second dummy layer 46B. To form the preliminary first gate structure 46P and the preliminary second gate structure 46N, the interface layer, the gate dielectric layer, the first dummy later, and the second dummy layer are stacked, and the stacked structure is etched. The first interface layer 44P and the second interface layer 44N may include a silicon oxide. For example, the silicon oxide may be formed by an oxidation process. The first gate dielectric layer 45P and the second gate dielectric layer 45N may be formed of a high-k material.

As described above, in the second embodiment, the first Interface layer 44P, the second interface layer 44N, the first gate dielectric layer 45P, and the second gate dielectric layer 45N are formed early. This is referred to as a High k First (HKF) process.

Figure 4B:
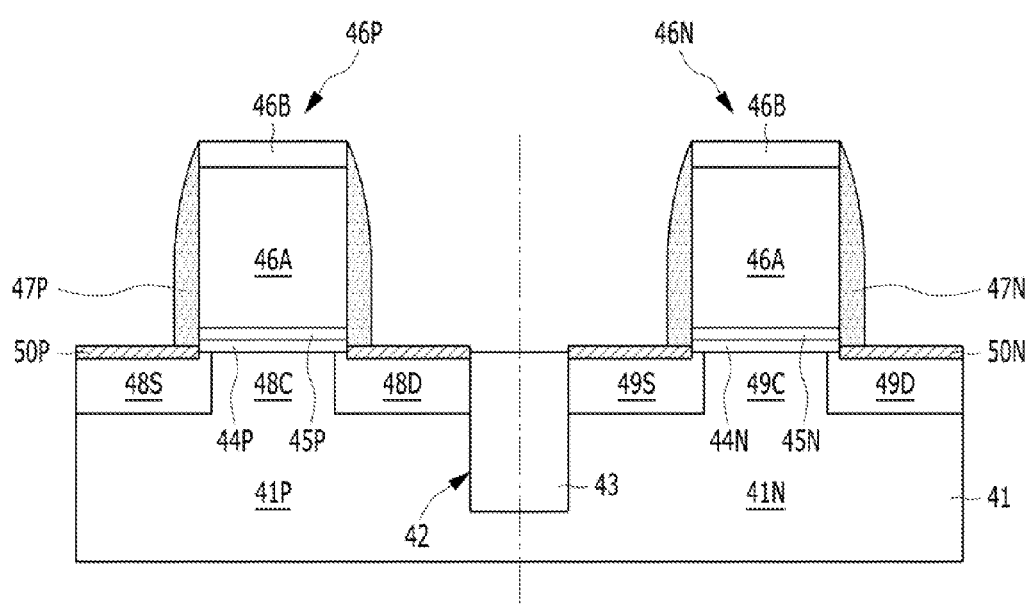

Referring to FIG. 4B, first spacers 47P are formed on both sidewalls of the preliminary first gate structure 46P. Second spacers 47N are formed on both sidewalls of the preliminary second gate structure 46N. The first spacers 47P and the second spacers 47N may be formed through the same process.

The first spacers 47P and the second spacers 47N may be formed of a silicon nitride. For example, the first spacers 47P and the second spacers 47N may be formed by depositing a silicon nitride over the substrate 41 including the preliminary first gate structure 46P and the preliminary second gate structure 46N and performing an etch-back process. The first spacers 47P and the second spacers 47N may be referred to as gate spacers. The first spacers 47P and the second spacers 47N may be of a multi-layer structure. For example, the first spacers 47P and the second spacers 47N may be formed of a combination of a silicon oxide and a silicon nitride including ON (Oxide/Nitride), ONO (Oxide/Nitride/Oxide), OON (Oxide/Oxide/Nitride), NON (Nitride/Oxide/Nitride), or ONON (Oxide/Nitride/Oxide/Nitride).

A first source region 48S and a first drain region 48D are formed in the first region 41P of the substrate 41. The first source region 48S and the first drain region 48D may be formed by sequentially performing a doping process and an activation annealing process. The doping process may include a plasma doping process or an implantation process. The first source region 48S and the first drain region 48D may be doped with a P-type impurity. The first source region 48S and the first drain region 48D may be doped with boron, indium or a mixture thereof. Although not illustrated in the drawing, the first source region 48S and the first drain region 48D may further include a source/drain extension (SDE) and a HALO region. The second region 41N may be masked while the first source region 48S and the first drain region 48D are formed. The substrate 41 between the first source region 48S and the first drain region 48D becomes a first channel region 48C. The first channel region 48C may include a silicon germanium channel.

A second source region 49S and a second drain region 49D are formed in the second region 41N of the substrate 41. The second source region 49S and the second drain region 49D may be formed by sequentially performing a doping process and an activation annealing process. The doping process may include a plasma doping process or an implantation process. The second source region 49S and the second drain region 49D may be doped with an N-type impurity. The second source region 49S and the second drain region 49D may be doped with arsenic, phosphorus, an antimony or a combination thereof. Although not illustrated in the drawing, the second source region 49S and the second drain region 49D may further include a source/drain extension (SDE) and a HALO region. The first region 41P may be masked while the second source region 49S and the second drain region 49D are formed. The substrate between the second source region 49S and the second drain region 49D becomes a second channel region 49C. The second channel region 49C may include a silicon channel.

A first metal silicide layer 50P and a second metal silicide layer 50N are formed. The first metal silicide layer 50P is formed over the first source region 48S and the first drain region 48D. The second metal silicide layer 50N is formed over the second source region 49S and the second drain region 49D. The first metal silicide layer 50P and the second metal silicide layer 50N are formed of the same material. The first metal silicide layer 50P and the second metal silicide layer 50N may be nickel-containing silicide layers. For example, the first metal silicide layer 50P and the second metal silicide layer 50N may be nickel silicide layers or nickel platinum silicide layers.

Figure 4C:
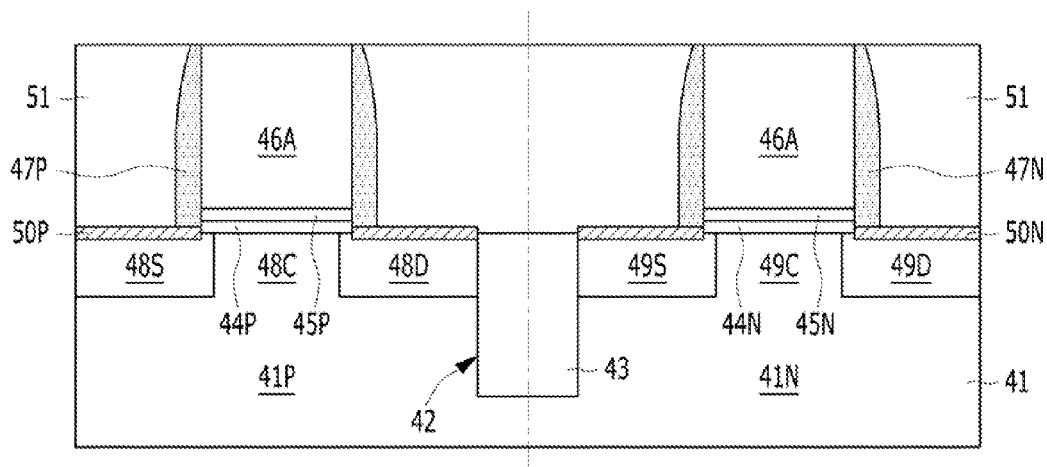

Referring to FIG. 4C, an inter-layer dielectric layer 51 is formed over the substrate 41. The inter-layer dielectric layer 51 may include a silicon oxide, a low dielectric material, or a combination thereof. The inter-layer dielectric layer 51 may be planarized to expose the first dummy layer 14B. For example, the inter-layer dielectric layer 51 and the second dummy layer 46B are planarized until the upper surface of the first dummy layer 46A is exposed by a Chemical Mechanical Polishing (CMP) process.

Figure 4D:
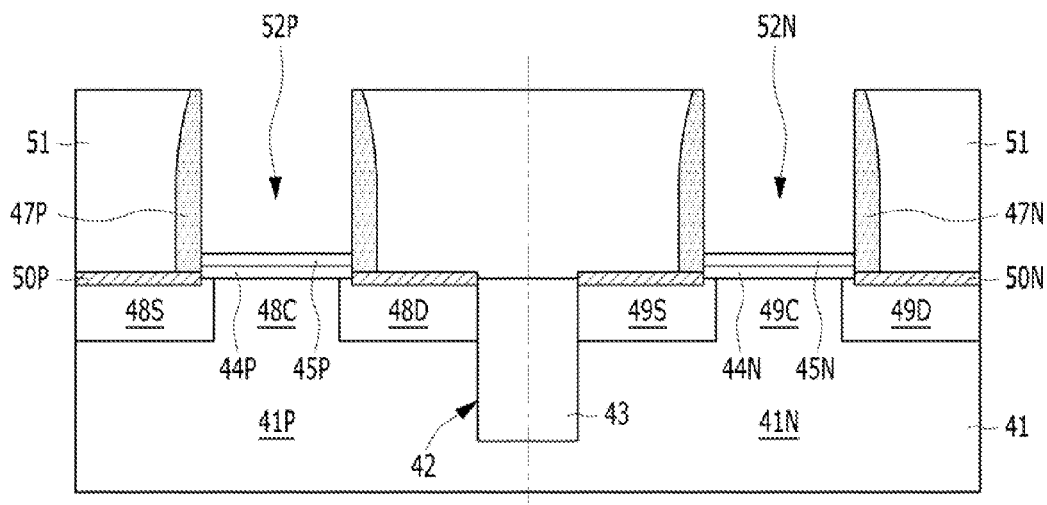

Referring to FIG. 4D, a first trench 52P and a second trench 52N are formed. The first trench 52P is formed in the first region 41P, and the second trench 52N is formed in the second region 41N. The first trench 52P and the second trench 52N may be formed by removing the first dummy layer 46A. The first dummy layer 46A may be removed by a wet etch process or a dry etch process. As the first dummy layer 46A is removed, the surfaces of the first gate dielectric layer 45P and the second gate dielectric layer 45N may be exposed.

Figure 4E:
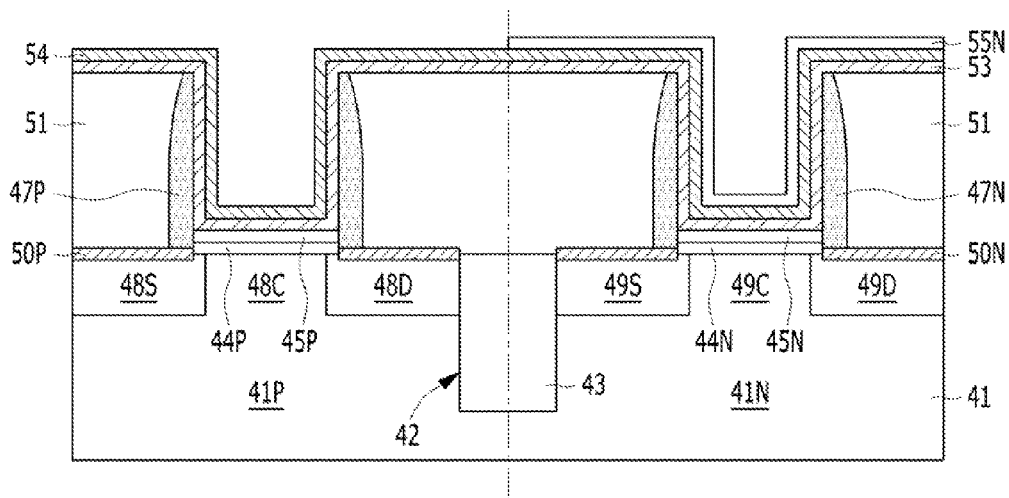

Referring to FIG. 4E, a capping layer 53 and an etch stop layer 54 are stacked. The capping layer 53 and the etch stop layer 54 may be conformally formed in liner patterns over the first gate dielectric layer 45P, the second gate dielectric layer 45N, and the inter-layer dielectric layer 51 which are formed in the first trench 52P and the second trench 52N. The capping layer 53 and the etch stop layer 54 may be simultaneously formed in the first region 41P and the second region 41N. The capping layer 53 and the etch stop layer 54 may be formed of a metal nitride. The capping layer 53 may be formed of a titanium nitride, whereas the etch stop layer 54 may be formed of a tantalum nitride (TaN).

A sacrificial layer pattern 55N is formed over the etch stop layer 54 in the second region 41N. A method of forming the sacrificial layer pattern 55N is described with reference to FIGS. 2E and 2F. The sacrificial layer pattern 55N may include a chloride-reactive material. The sacrificial layer pattern 55N may be formed of a lanthanum-containing material. The sacrificial layer pattern 55N may be formed of a lanthanum oxide.

Figure 4F:
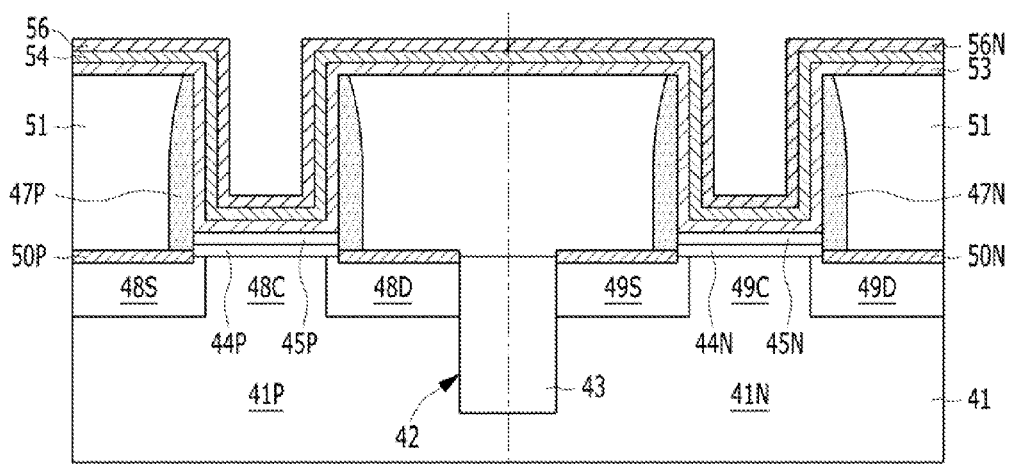

Referring to FIG. 4F, a first work function layer 56 is formed. The first work function layer 56 is formed in the first region 41P. The first work function layer 56 may have a work function appropriate for a P-type channel transistor. For example, the first work function layer 56 may be formed of a P-type work function metal layer. The first work function layer 56 may be a first titanium-containing layer having a P-type work function. The P-type work function refers to a high work function greater than approximately 4.9 eV. The first titanium-containing layer may contain a first species having a P-type work function. The first species may include nitrogen. In an embodiment, the first work function layer 56 may be a titanium layer containing the first species. For example, the first work function layer 56 may be formed of a titanium nitride (TiN). The first work function layer 56 may be formed by a Chemical Vapor Deposition using titanium tetrachloride ($TiCl_4$) and ammonia ($NH_3$).

While the first work function layer 56 is formed in the first region 41P, the sacrificial layer pattern 55N present in the second region 41N reacts with titanium tetrachloride ($TiCl_4$) to form a sacrificial compound 56N in the second region 41N. The sacrificial compound 56N is a material derived from the sacrificial layer pattern 55N. The sacrificial compound 56N may be formed from a reaction between chloride and lanthanum included in the sacrificial layer pattern 55N. That is, the sacrificial compound 56N may be formed by a reaction between the sacrificial layer pattern 55N and material forming of the first work function layer 56. For example, titanium tetrachloride ($TiCl_4$) is applied to the first region 11P to form the first work function layer 56. The titanium tetrachloride ($TiCl_4$) applied to the second region 11N reacts with the lanthanum included in the sacrificial layer pattern 55N to form a lanthanum chloride, resulting in the sacrificial compound 56N. Thus, the sacrificial compound 56N of the lanthanum chloride is formed in the second region 41N only.

As described above, while the first work function layer 56 is formed in the first region 41P, the sacrificial compound 56N is formed in the second region 41N. The first work function layer 56 is not deposited in the second region 41N due to the sacrificial compound 56N. The first work function layer 56 is formed over the etch stop layer 54 in the first region 41P, and the sacrificial compound 56N is formed over the etch stop layer 54 in the second region 41N.

Figure 4G:
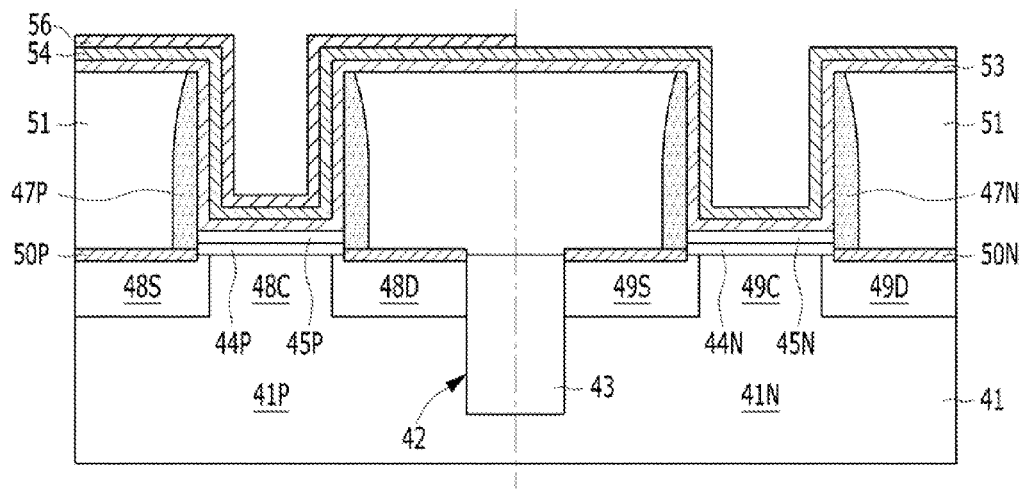

Referring to FIG. 4G, the sacrificial compound 56N is removed. As a result, the first work function layer 56 remains over the first region 41P only. To remove the sacrificial compound 56N, a cleaning process may be performed.

As described above, the first work function layer 56 may be selectively formed in the first region 41P alone through the processes of forming the first work function layer 56 and removing the sacrificial compound 56N. In other words, the first work function layer 56 may be selectively formed in the first region 41P alone without a mask process and an etch process.

Figure 4H:
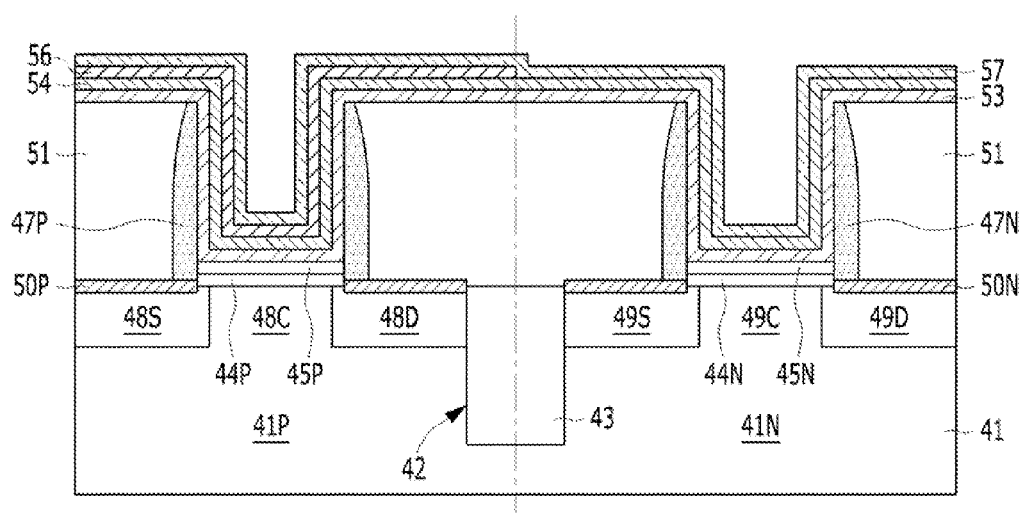

Referring to FIG. 4H, a second work function layer 57 is formed. The second work function layer 57 is formed over the etch stop layer 54 and the first work function layer 56. The second work function layer 57 may have a work function appropriate for an N-channel transistor. The second work function layer 57 may be a second titanium-containing layer having an N-type work function. The N-type work function refers to a work function lower than approximately 4.2 eV. The second titanium-containing layer may contain a second species having an N-type work function. The second species may include carbon (C), aluminum (Al), or a mixture thereof. In an embodiment, the second work function layer 57 may be a titanium layer containing the second species. For example, the second work function layer 57 may be formed of TiAl, TiC, or TiAlC. The second work function layer 57 may be formed in the second region 41N and the first region 41P. The second work function layer 57 formed over the first region 41P does not affect the threshold voltage of the P-channel transistor.

Figure 4I:
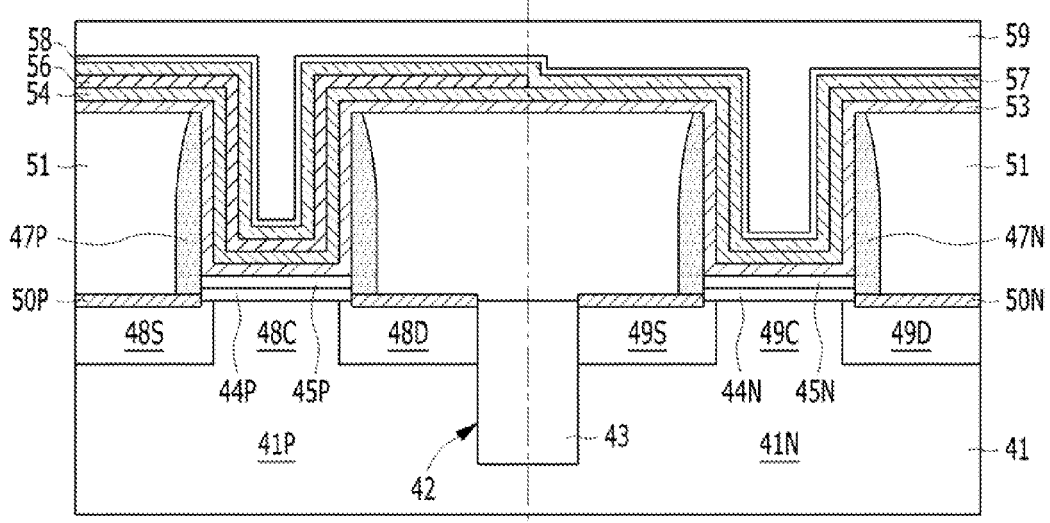

Referring to FIG. 4I, a low resistivity layer 59 is formed over the second work function layer 57. The low resistivity layer 59 fills the first trench 52P and the second trench 52N. The low resistivity layer 59 may include a low resistivity metal layer. The low resistivity layer 59 may include tungsten, cobalt, titanium, aluminum, or a combination thereof. Before the low resistivity layer 59 fills the first trench 52P and the second trench 52N, a barrier layer 58 may be conformally formed in a liner pattern along a contour of the first and the second trenches 52P and 52N. The barrier layer 58 may include a titanium nitride (TiN). The barrier layer 58 may prevent the low resistivity layer 59 and the second work function layer 57 from being diffused into each other. The stacked structure of the barrier layer 58 and the low resistivity layer 59 may include TiN/W, TiN/Ti/Al, and TiN/Co/Al.

Figure 4J:
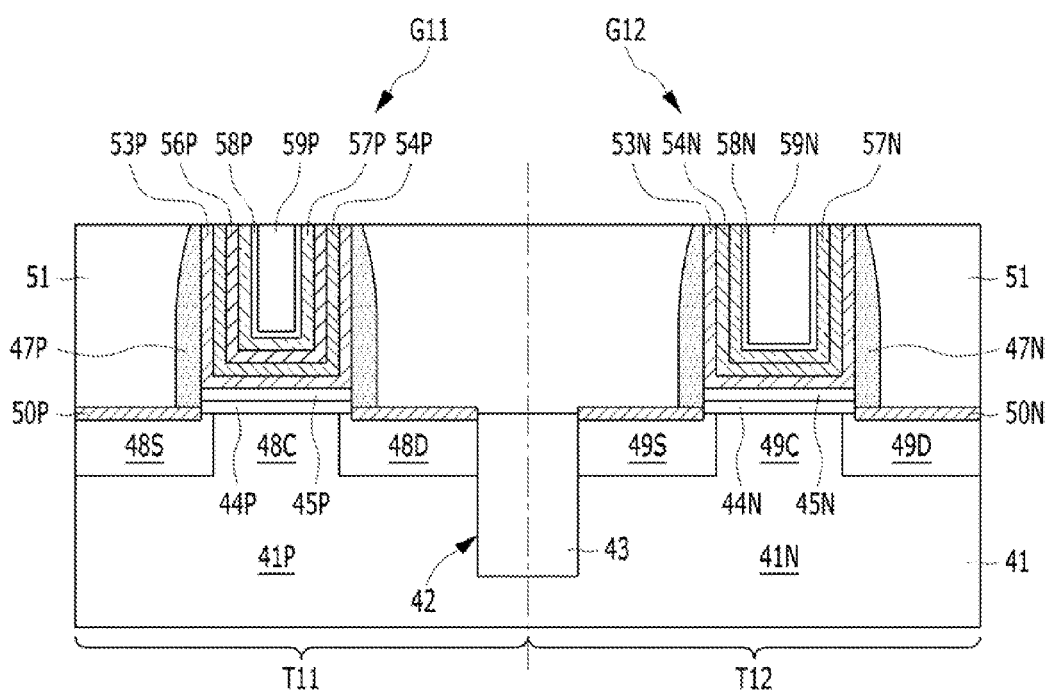

Referring to FIG. 4J, the low resistivity layer 59 is planarized until the surface of the inter-layer dielectric layer 51 is exposed. After the low resistivity layer 59 is planarized, the barrier layer 58, the second work function layer 57, the first work function layer 56, the etch stop layer 54, and the capping layer 53 may be successively planarized.

Through a series of the planarization processes, a first gate structure G11 and a second gate structure G12 are formed in the first region 41P and the second region 41N, respectively.

The first gate structure G11 is disposed in the first region 41P. The first gate structure G11 includes the first interface layer 44P, a first gate dielectric layer 45P, a first capping layer 53P, a first etch stop layer 54P, a first work function layer 56P, a dummy second work function layer 57P, a first barrier layer 58P, and a first low resistivity layer 59P. The dummy second work function layer 57P is formed by planarizing the second work function layer 57. Therefore, a first transistor T11 including the first gate structure G11, the first source region 48S, the first drain region 48D, and the first channel region 48C is formed. The first transistor T11 is a P-channel transistor.

The second gate structure G12 is disposed in the second region 41N. The second gate structure G12 includes the second interface layer 44N, a second gate dielectric layer 45N, a second capping layer 53N, a second etch stop layer 54N, a second work function layer 57N, a second barrier layer 58N, and a second low resistivity layer 59N. Therefore, a second transistor T12 including the second gate structure G12, the second source region 49S, the second drain region 49D, and the second channel region 49C is formed. The second transistor T12 is an N-channel transistor.

As described above, the first gate structure G11 and the second gate structure G12 are formed by a Replacement Metal Gate (RMG) process. That is, the first gate structure G11 is formed after the first source region 48S and the first drain region 48D are formed. Similarly, the second gate structure G12 is formed after the second source region 49S and the second drain region 49D are formed. The method of forming a gate structure by the RMG process is also referred to as a 'Metal Gate Last (MGL) process. Since the first gate structure G11 and the second gate structure G12 are formed by the metal gate last process, thermal stability of the first work function layer 56P and the second work function layer 57N is improved.

Also, since the first gate dielectric layer 45P and the second gate dielectric layer 45N are formed before the first trench 52P and the second trench 52N are formed, the process according to the second embodiment is referred to as a High K Last (HKL).

In short, the RMG structure in accordance with the second embodiment may be formed by the 'HKL (High K Last)/MGL (Metal Gate Last) process.

Figure 4K:
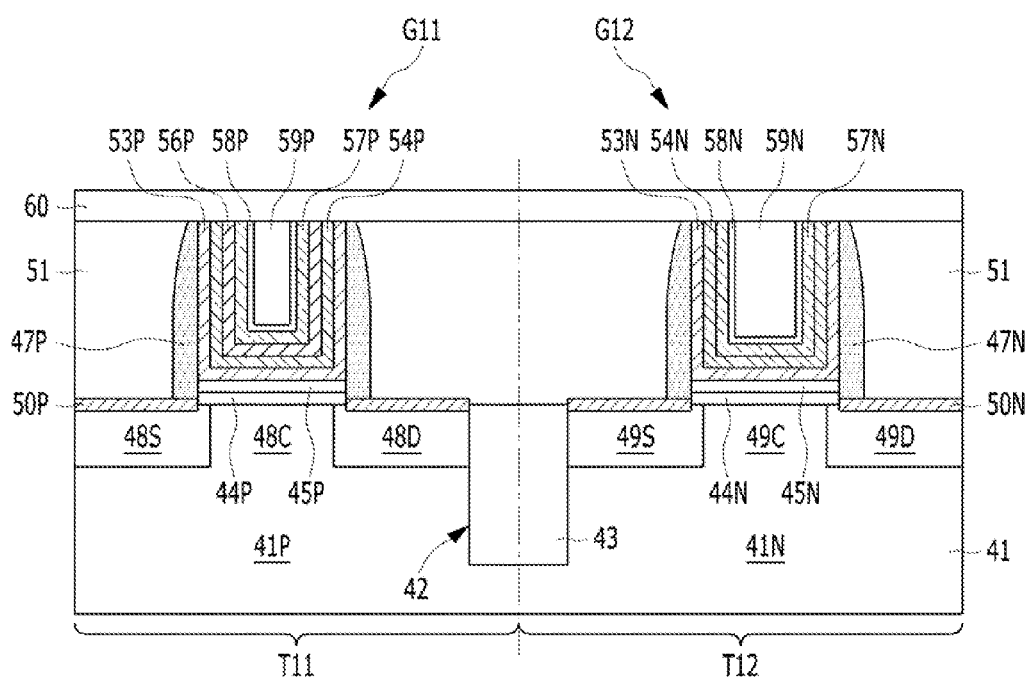

Referring to FIG. 4K, a cap layer 60 is formed. The cap layer 60 may be formed of a silicon nitride. The cap layer 60 protects the first work function layer 56P, the second work function layer 56N, the first low resistivity layer 59P, and the second low resistivity layer 59N.

According to another embodiment, when the preliminary first gate structure and the preliminary second gate structure are formed, the capping layer 53 and the etch stop layer 54 may be stacked. Therefore, the sacrificial layer pattern 55N and the first work function layer 56 may be formed after the first trench 52P and the second trench 52N are formed.

Although the embodiments are directed to a CMOSFET with an RMG structure formed using a gate last process, the embodiments may be applied to a method for fabricating a CMOSFET using a gate first process. According to the gate first process, a gate structure is formed before a source region and a drain region are formed and a dummy structure is not formed. According to the gate first process, the gate structure is formed before an activation annealing process that is performed for forming a source region and a drain region.

Also, the embodiments may be applied to a method for fabricating a CMOSFET including a fin-type transistor as well.

According to the embodiments, the stability of a work function layer may be improved by performing an activation annealing process, which is performed to form a source region and a drain region, before the work function layer is formed.

Also, since the work function layer is selectively formed through a process of forming and removing a sacrificial compound, a mask process and an etch process may be skipped.

What is claimed is:

1. A method for fabricating a semiconductor device comprising:
   forming a gate dielectric layer over a substrate;
   forming an etch stop layer over the gate dielectric layer;
   forming a sacrificial layer pattern over a second portion of the etch stop layer;
   forming a first work function layer that covers a first portion of the etch stop layer and a sacrificial compound that covers the second portion of the etch stop layer;
   exposing the second portion of the etch stop layer by removing the sacrificial compound; and
   forming a second work function layer over the second portion of the etch stop layer and the first work function layer,
   wherein the sacrificial compound is formed by a reaction between the sacrificial layer pattern and the first work function layer.

2. The method of claim 1, wherein the forming of the first work function layer that covers the first portion of the etch stop layer and the sacrificial compound that covers the second portion of the etch stop layer includes:
   forming a sacrificial layer over the etch stop layer;
   removing the sacrificial layer over the first portion of the etch stop layer to form a sacrificial layer pattern over the second portion of the etch stop layer; and
   forming the first work function layer over the sacrificial layer pattern and the first portion of the etch stop layer,
   wherein the sacrificial layer pattern is transformed into the sacrificial compound while the first work function layer is formed over the first portion of the etch stop layer.

3. The method of claim 2, wherein the sacrificial layer includes lanthanum oxide, and the sacrificial compound includes lanthanum chloride.

4. The method of claim 3, wherein the first work function layer includes titanium nitride,
   wherein the first work function layer is formed by using titanium tetrachloride (TiCl$_4$).

5. The method of claim 1, wherein the first work function layer includes a titanium layer containing a first species, wherein the second work function layer includes a titanium layer containing a second species, and
   wherein the second work function layer and the first work function layer have different work functions.

6. The method of claim 5, wherein the first species includes nitrogen, and the second species includes aluminum, carbon, or a combination thereof.

7. The method of claim 1, wherein the etch stop layer includes tantalum nitride.

8. The method of claim 1, further comprising:
   forming a capping layer over the gate dielectric layer, before the forming of the etch stop layer,
   wherein the capping layer includes titanium nitride.

9. A method for fabricating a semiconductor device, comprising:
   preparing a substrate including a first channel region and a second channel region;
   forming an inter-layer dielectric layer over the substrate, wherein the inter-layer dielectric layer includes a first trench exposing the first channel region and a second trench exposing the second channel region;
   forming a gate dielectric layer in the first trench and the second trench;
   forming an etch stop layer over the gate dielectric layer;
   forming a sacrificial layer pattern over the etch stop layer in the second trench;
   forming a first work function layer over the etch stop layer in the first trench and forming a sacrificial compound over the etch stop layer in the second trench;
   exposing the etch stop layer in the second trench by removing the sacrificial compound;
   forming a second work function layer over the first work function layer in the first trench and over the etch stop layer in the second trench; and
   forming a low resistivity layer over the second work function layer to fill the first trench and the second trench,
   wherein the sacrificial compound is formed by a reaction between the sacrificial layer pattern and the first work function layer.

10. The method of claim 9, wherein the forming of the first work function layer over the etch stop layer in the first trench and forming of the sacrificial compound over the etch stop layer in the second trench includes:
    forming a sacrificial layer over the etch stop layer;
    removing the sacrificial layer over the etch stop layer in the first trench to form a sacrificial layer pattern over the etch stop layer in the second trench; and
    applying first work function material to the first and the second trenches to form the first work function layer over the etch stop layer in the first trench and to transform the sacrificial layer pattern in the second trench into the sacrificial compound.

11. The method of claim 10, wherein the sacrificial layer includes lanthanum oxide, and the sacrificial compound includes lanthanum chloride.

12. The method of claim 11, wherein the first work function layer includes titanium nitride, and
    wherein the first work function material includes titanium tetrachloride (TiCl$_4$).

13. The method of claim 9, wherein the first work function layer includes titanium nitride, and
    wherein the second work function layer includes a titanium layer containing a second species, and
    wherein the second species is suitable to make the second work function layer and the first work function layer have different work functions.

14. The method of claim 13, wherein the species includes aluminum, carbon, or a combination thereof.

15. The method of claim 9, further comprising:
    forming a capping layer over the gate dielectric layer, before the forming of the etch stop layer,
    wherein the capping layer includes titanium nitride.

16. The method of claim 9, wherein the etch stop layer includes tantalum nitride.

17. The method of claim 9, wherein the first work function layer is suitable to serve as a P-channel transistor, and the second work function layer is suitable to serve as an N-channel transistor.

* * * * *